United States Patent
Imai et al.

(10) Patent No.: US 10,241,403 B2
(45) Date of Patent: Mar. 26, 2019

(54) NEGATIVE PHOTOSENSITIVE COMPOSITION AND PATTERN FORMATION METHOD

(71) Applicant: TOKYO OHKA KOGYO CO., LTD., Kawasaki-shi (JP)

(72) Inventors: Hirofumi Imai, Kawasaki (JP); Tomoyuki Ando, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/546,132

(22) PCT Filed: Mar. 25, 2016

(86) PCT No.: PCT/JP2016/059657
§ 371 (c)(1),
(2) Date: Jul. 25, 2017

(87) PCT Pub. No.: WO2016/153044
PCT Pub. Date: Sep. 29, 2016

(65) Prior Publication Data
US 2018/0095366 A1   Apr. 5, 2018

(30) Foreign Application Priority Data

Mar. 26, 2015 (JP) .................. 2015-064128
Dec. 10, 2015 (JP) .................. 2015-241350

(51) Int. Cl.
G03F 7/004 (2006.01)
G03F 7/038 (2006.01)

(52) U.S. Cl.
CPC ............ G03F 7/038 (2013.01); G03F 7/0045 (2013.01)

(58) Field of Classification Search
CPC ........ G03F 7/038; G03F 7/0385; G03F 7/091; G03F 7/094; G03F 7/11; C08F 2220/382
USPC .................................. 522/31, 25
See application file for complete search history.

(56) References Cited

U.S. PATENT DOCUMENTS

| 9,709,890 | B2 | 7/2017 | Hatakeyama et al. | |
|---|---|---|---|---|
| 2006/0188820 | A1 | 8/2006 | Maeda | |
| 2008/0064780 | A1* | 3/2008 | Thies | C08F 283/06 522/25 |
| 2011/0177302 | A1* | 7/2011 | Takita | C08F 20/28 428/195.1 |
| 2012/0141940 | A1 | 6/2012 | Shimizu et al. | |
| 2012/0229556 | A1 | 9/2012 | Ikegame et al. | |
| 2012/0229744 | A1* | 9/2012 | Hattori | C08F 2/50 349/124 |
| 2013/0076458 | A1* | 3/2013 | Katou | C08F 2/48 333/195 |
| 2013/0235119 | A1 | 9/2013 | Takahashi et al. | |
| 2014/0113236 | A1 | 4/2014 | Senzaki et al. | |
| 2014/0307022 | A1 | 10/2014 | Takahashi | |
| 2015/0293448 | A1 | 10/2015 | Imaizumi et al. | |
| 2016/0085149 | A1 | 3/2016 | Hatakeyama et al. | |

FOREIGN PATENT DOCUMENTS

| EP | 0844255 A1 | 5/1998 |
|---|---|---|
| EP | 2284165 A1 | 2/2011 |
| EP | 2399905 A1 | 12/2011 |
| JP | A-2005-055865 | 3/2005 |
| JP | A-2010-197568 | 9/2010 |
| JP | A-2011-164216 | 8/2011 |

(Continued)

OTHER PUBLICATIONS

Annex to Communication of Apr. 30, 2018 from European Patent Office with respect to Application 16 768 947.0, 2 pages (Year: 2018).*
International Search Report in International Patent Application No. PCT/JP2016/059657, dated Jun. 28, 2016.
Notice of Allowance in Japanese Patent Application No. 2017-508468, dated Aug. 8, 2017.
Search Report in European Patent Application No. 16768947.0, dated Mar. 6, 2018.

*Primary Examiner* — Cynthia Hamilton
(74) *Attorney, Agent, or Firm* — Knobbe Martens Olson & Bear LLP

(57) ABSTRACT

A negative photosensitive composition including an epoxy group-containing resin; and a cationic polymerization initiator containing one or more types of the following cationic polymerization initiators: a compound represented by formula (b0-1) and a compound represented by formula (b0-2), and a cationic polymerization initiator which generates an acid having a pKa of −3 or more. In the formulae, $R^{b01}$ to $R^{b04}$ are each independently a fluorine atom or an aryl group which may have a substituent, $R^{b05}$ is a fluorine atom or a fluorinated alkyl group which may have a substituent, a plurality of $R^{b05}$'s may be the same as or different from each other, q is an integer of 1 or more, and $Q^{q+}$'s are each independently a q-valent organic cation.

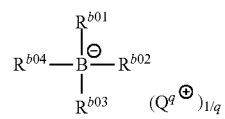

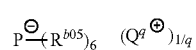

4 Claims, No Drawings

(56) References Cited

FOREIGN PATENT DOCUMENTS

| | | |
|---|---|---|
| JP | A-2011-227246 | 11/2011 |
| JP | A-2012-137741 | 7/2012 |
| JP | A-2012-141578 | 7/2012 |
| JP | A-2014-085625 | 5/2014 |
| JP | A-2014-203062 | 10/2014 |
| JP | A-2015-143819 | 8/2015 |
| JP | A-2016-061933 | 4/2016 |
| WO | WO 2012/169620 A1 | 12/2012 |

* cited by examiner

NEGATIVE PHOTOSENSITIVE COMPOSITION AND PATTERN FORMATION METHOD

TECHNICAL FIELD

The present invention relates to a negative photosensitive composition and a pattern formation method.

This application claims priority based on Japanese Patent Application No. 2015-064128 filed on Mar. 26, 2015 and Japanese Patent Application No. 2015-241350 filed on Dec. 10, 2015, the content of which is incorporated herein by reference.

BACKGROUND ART

With the recent trend toward miniaturization and increased density in electronic devices, there is an increasing demand for photosensitive dry films used for manufacturing LSI and the like. For example, a photosensitive dry film is adhered to the surface of a semiconductor wafer or the like, the photosensitive dry film is subjected to selective exposure with radiation such as light or electron beams, and development processing is performed to form a pattern, then pressure bonding is performed with a transparent substrate (for example, a glass substrate) or the like, and thus it is possible to use the photosensitive dry film as a spacer between a semiconductor wafer and a transparent substrate (refer to, for example, PTL 1).

The photosensitive resin layer of the photosensitive dry film includes a photosensitive material, and is required to be patternable by a photolithography method and also to be able to retain a shape as a spacer or the like. In addition, since pressure bonding is carried out with a transparent substrate after exposure and development, it is also required to have excellent adhesion after patterning, in addition to developability and resolution.

In the related art, as a negative photosensitive composition used for a photosensitive dry film, compositions containing a base material component formed of a novolac resin and an acid generator component such as diazonaphthoquinone have been used. However, since diazonaphthoquinone-based photoacid generators exhibit absorption with respect to the wavelength of light used for exposure, there are problems in that the light intensity differs during the exposure between the upper portion and the lower portion (in the vicinity of the interface with the substrate) of the thick film resist film and the shape of the obtained pattern does not become a desired shape such as a rectangle.

On the other hand, in recent years, as a negative photosensitive composition for a thick film resist or a photosensitive dry film, a composition containing a base material component containing an epoxy group and a cationic polymerization initiator is also used. As the cationic polymerization initiator, a fluorinated antimony-based cationic polymerization initiator having high sensitivity to light (for example, a polymerization initiator having $SbF_6^-$ in the anion moiety) is widely used.

However, antimony (Sb) is an element for which there are concerns about influence on the environment, human carcinogenicity, and influence on animals and plants, and many antimony compounds including the antimony element are designated as harmful substances. Therefore, in the case where an antimony-based cationic polymerization initiator is used, careful attention must be paid during transportation, storage, disposal, and the like. From such a viewpoint, a negative photosensitive composition using a non-antimony-based cationic polymerization initiator has also recently been proposed (refer to, for example, PTLs 2 and 3).

In addition, a technique (pattern forming technique) of forming a fine pattern on a substrate or the like and processing the lower layer of the pattern by performing etching using this pattern as a mask is widely adopted in the manufacturing of semiconductor elements and liquid crystal display elements. The fine pattern is usually made of an organic material and is formed by a technique such as a lithography method or a nanoimprinting method.

For example, in the lithography method, a step in which a photosensitive film (resist film) is formed on a support such as a substrate by using a photosensitive material (resist material) including a base material component such as a resin, selective exposure with radiation such as light or electron beams is performed on the resist film, and developing treatment is performed to form a pattern of a predetermined shape. As necessary, a step of processing the substrate or the like by etching or plating is performed by using the pattern as a mask to manufacture a semiconductor element or the like. Resist materials are classified into positive and negative materials, and a resist material whose solubility in a developing solution increases in the exposed area is a positive type and a resist material whose solubility in a developing solution decreases in the exposed area is a negative type.

In recent years, there has been an increasing demand for a photosensitive composition (resist composition for a thick film) capable of forming a resist film with a high film thickness (refer to PTL 2 and the like). The resist composition for a thick film is used, for example, in the formation of bumps and metal posts through a plating step. For example, a thick film resist layer having a film thickness of approximately 20 µm is formed on a support and exposed and developed via a predetermined mask pattern to form a resist pattern in which portions where a bump or a metal post is to be formed are selectively removed (delaminated). It is possible to form a bump or a metal post by embedding a conductor such as copper in the removed portion (non-resist portion) through plating and then removing the peripheral resist pattern. As the resist composition for a thick film, the photosensitive composition similar tos the negative photosensitive composition used for the photosensitive dry film or the like is used.

CITATION LIST

Patent Literature

[PTL 1] Japanese Unexamined Patent Application, Publication No. 2011-227246

[PTL 2] Japanese Unexamined Patent Application, Publication No. 2012-137741

[PTL 3] Japanese Unexamined Patent Application, Publication No. 2014-85625

SUMMARY OF INVENTION

Technical Problem

A cationic polymerization initiator which is a non-antimony-based cationic polymerization initiator and has a sensitivity equal to or more than that of an antimony-based polymerization initiator has also been recently proposed. However, since the non-antimony-based cationic polymerization initiator used in PTLs 2 and 3 and the like is extremely sensitive, in order to perform patterning with high resolution, it is necessary to adjust the addition amount in very small amounts, and there is a problem in that optimization is difficult. In addition, since the non-antimony-based cationic polymerization initiator generates a strong acid, the amount of addition of the polymerization initiator is reduced. As a result, there is also a problem in that the cross-linking rate (curing rate) after photopolymerization of the base material component is lowered and the patterning performance may also be deteriorated.

The present invention has been made in view of the circumstances, and it is an object of the present invention to provide a negative photosensitive composition and a pattern formation method which are able to form a high-resolution pattern by having appropriate sensitivity.

Solution to Problem

In order to solve the problem, the present invention adopts the following configuration.

That is, a first aspect of the present invention is a negative photosensitive composition including an epoxy group-containing resin (A), and a cationic polymerization initiator (B), in which the cationic polymerization initiator (B) includes at least one cationic polymerization initiator (B0) selected from the group consisting of a compound represented by general formula (b0-1) and a compound represented by general formula (b0-2), and a cationic polymerization initiator (B1) which generates an acid having a pKa of −3 or more.

[Chemical formula 1]

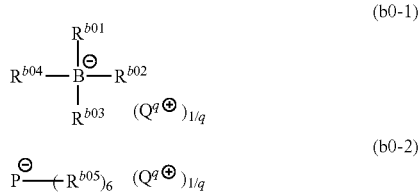

In the formulae, $R^{b01}$ to $R^{b04}$ are each independently a fluorine atom or an aryl group which may have a substituent, $R^{b05}$ is a fluorine atom or a fluorinated alkyl group which may have a substituent, plural $R^{b05}$'s may be the same as or different from each other, q is an integer of 1 or more, and $Q^{q+}$'s are each independently a q-valent organic cation.

A second aspect of the present invention is a pattern formation method including a step of forming a film on a support using the negative photosensitive composition according to the first aspect, a step of selectively exposing the film, and a step of developing the exposed film to form a negative pattern.

Advantageous Effects of Invention

According to the negative photosensitive composition of the present invention, it is possible to adjust the cationic polymerization initiator to an appropriate sensitivity, and as a result, it is possible to form a high-resolution pattern with an excellent pattern shape.

DESCRIPTION OF EMBODIMENTS

In the present specification and claims, "aliphatic" is a concept relative to aromatic and is defined to mean a group having no aromaticity, a compound having no aromaticity, or the like.

Unless otherwise specified, "alkyl group" is intended to include linear, branched, and cyclic monovalent saturated hydrocarbon groups. The same applies to the alkyl group in the alkoxy group.

Unless otherwise specified, the "alkylene group" is intended to include linear, branched, and cyclic divalent saturated hydrocarbon groups.

A "halogenated alkyl group" is a group in which a part or all of the hydrogen atoms of the alkyl group are substituted with a halogen atom, and examples of halogen atoms include a fluorine atom, a chlorine atom, a bromine atom, and an iodine atom.

A "fluorinated alkyl group" or "fluorinated alkylene group" refers to a group in which a part or all of the hydrogen atoms of the alkyl group or the alkylene group are substituted with a fluorine atom.

"Constituent unit" means a monomer unit (monomer unit) forming a polymer compound (a resin, a polymer, or a copolymer).

A case where the description of "may have a substituent" is made, the description includes a case where the hydrogen atom (—H) is substituted with a monovalent group and a case where the methylene group (—CH$_2$—) is substituted with a divalent group.

"Exposure" is a concept including the irradiation of radiation as a whole.

An "acrylic acid ester" is a compound in which a hydrogen atom at the carboxy group terminal of acrylic acid (CH$_2$=CH—COOH) is substituted with an organic group.

In the acrylic acid ester, a hydrogen atom bonded to a carbon atom at the α-position may be substituted with a substituent. The substituent ($R^{\alpha 0}$) for substituting the hydrogen atom bonded to the α-position carbon atom is an atom or group other than a hydrogen atom, and examples thereof include an alkyl group having 1 to 5 carbon atoms, a halogenated alkyl group having 1 to 5 carbon atoms, and the like. In addition, the substituent is also intended to include an itaconic acid diester in which the substituent ($R^{\alpha 0}$) is substituted with a substituent containing an ester bond or an α-hydroxyacrylic acid ester in which the substituent ($R^{\alpha 0}$) is substituted with a hydroxyalkyl group or a group in which the hydroxyl group has been modified. Unless otherwise specified, the carbon atom at the α-position of the acrylic acid ester is a carbon atom to which the carbonyl group of acrylic acid is bonded.

The alkyl group as the α-position substituent is preferably a linear or branched alkyl group, specifically an alkyl group having 1 to 5 carbon atoms (for example, a methyl group, an ethyl group, a n-propyl group, an isopropyl group, an n-butyl group, an isobutyl group, a tert-butyl group, a pentyl group, an isopentyl group, and a neopentyl group) and the like.

In addition, specific examples of the halogenated alkyl group as the substituent at the α-position include a group in which a part or all of the hydrogen atoms of the "alkyl group as the substituent at the α-position" are substituted with a halogen atom. Examples of the halogen atom include a fluorine atom, a chlorine atom, a bromine atom, an iodine atom, and the like, and a fluorine atom is particularly preferable.

In addition, specific examples of the hydroxyalkyl group as the substituent at the α-position include a group in which a part or all of the hydrogen atoms of the "alkyl group as the substituent at the α-position" are substituted with a hydroxyl group. The number of hydroxyl groups in the hydroxyalkyl group is preferably 1 to 5, and most preferably 1.

<<Negative Photosensitive Composition>>

The negative photosensitive composition (may be referred to below simply as "photosensitive composition") which is the first aspect of the present invention contains an epoxy group-containing resin (A) (may also be referred to below as "component (A)") and a cationic polymerization initiator (B) (may also be referred to below as "component (B)").

When a film is formed using such a negative photosensitive composition and the film is selectively exposed, in the exposed areas of the film, the cation moiety of the component (B) is decomposed to generate an acid, the epoxy group in the component (A) undergoes ring-opening polymerization due to the action of the acid to decrease the solubility of the component (A) in the developing solution, whereas, in the unexposed areas of the film, the dissolution of the component (A) does not change, thus a difference in solubility occurs between the exposed area and the unexposed areas with respect to the developing solution. Therefore, when the film is developed, the unexposed areas are dissolved and removed, and a negative pattern is formed.

<Epoxy Group-Containing Resin (A): Component (A)>

The epoxy group-containing resin is not particularly limited, but may be any epoxy group-containing resin having an epoxy group in one molecule sufficient to form a pattern by exposure. Among these, at least one type of resin selected from the group consisting of novolac type epoxy resin (Anv), bisphenol A type epoxy resin (Abp), bisphenol F type epoxy resin, aliphatic epoxy resin, and acrylic resin (Aac) is preferably contained.

Examples of commercially available products thereof include, as bisphenol A type epoxy resins (Abp), JER-827, JER-828, JER-834, JER-1001, JER-1002, JER-1003, JER-1055, JER-1007, JER-1009, and JER-1010 (all manufactured by Mitsubishi Chemical Corporation), EPICLON 860, EPICLON 1050, EPICLON 1051, EPICLON 1055 (all manufactured by DIC Corporation), and the like; as the bisphenol F type epoxy resin, JER-806, JER-807, JER-4004, JER-4005, JER-4007, and JER-4010 (all manufactured by Mitsubishi Chemical Corporation), EPICLON 830, EPICLON 835 (all manufactured by DIC Corporation), LCE-21, RE-602S (all manufactured by Nippon Kayaku Co., Ltd.), and the like; as the novolac type epoxy resin (Anv), JER-152, JER-154, JER-157S70, JER-157S65, (all manufactured by Mitsubishi Chemical Corporation), EPICLON N-740, EPICLON N-740, EPICLON N-770, EPICLON N-775, EPICLON N-660, EPICLON N-665, EPICLON N-670, EPICLON N-673, EPICLON N-680, EPICLON N-690, EPICLON N-695, and EPICLON HP5000 (all manufactured by DIC Corporation), EOCN-1020 (all manufactured by Nippon Kayaku Co., Ltd.), and the like; as the aliphatic epoxy resin, ADEKA RESIN EP-4080S, ADEKA RESIN EP-4085S, and ADEKA RESIN EP-4088S (all manufactured by ADEKA Corporation), Celoxide 2021P, Celoxide 2081, Celoxide 2083, Celoxide 2085, EHPE-3150, EPOLEAD PB 3600, EPOLEAD PB 4700 (all manufactured by Daicel Chemical Industries Ltd.), Denacol EX-211 L, EX-212 L, EX-214 L, EX-216 L, EX-321 L, EX-850 L (all manufactured by Nagase ChemteX Corporation), and the like.

It is possible to use these alone or in a combination of two or more types.

More preferable examples of the epoxy resin among these are shown below.

[Novolac Type Epoxy Resin (Anv)]

As the novolac type epoxy resin (Anv), it is possible to use a resin represented by general formula (anv0).

[Chemical formula 2]

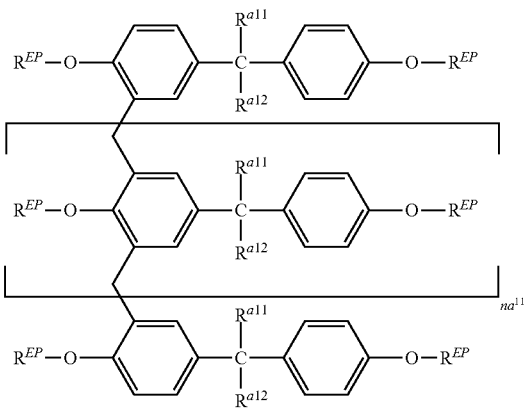

(anv0)

[In the formula, $R^{a11}$ and $R^{a12}$ each independently represent a hydrogen atom or an alkyl group having 1 to 5 carbon atoms, $na^{11}$ is an integer of 1 to 5, and $R^{EP}$ is an epoxy group-containing group.]

In formula (anv0), the alkyl group having 1 to 5 carbon atoms of $R^{a11}$ and $R^{a12}$ is, for example, a linear, a branched, or a cyclic alkyl group having 1 to 5 carbon atoms. Examples of the linear or branched alkyl group include a methyl group, an ethyl group, a propyl group, an isopropyl group, an n-butyl group, an isobutyl group, a tert-butyl group, a pentyl group, an isopentyl group, a neopentyl group, and the like, and examples of the cyclic alkyl group include a cyclobutyl group, a cyclopentyl group, and the like.

Among these, $R^{a11}$ and $R^{a12}$ are preferably a hydrogen atom or a methyl group.

In formula (anv0), $R^{EP}$ is an epoxy group-containing group.

The epoxy group-containing group of $R^{EP}$ is not particularly limited and may be a group formed solely of an epoxy group; a group formed solely of an alicyclic epoxy group; or a group having an epoxy group or an alicyclic epoxy group, or a divalent linking group.

The alicyclic epoxy group is an alicyclic group having an oxacyclopropane structure that is a three-membered ring ether, specifically, a group having an alicyclic group and an oxacyclopropane structure.

The alicyclic group which is the basic skeleton of the alicyclic epoxy group may be monocyclic or polycyclic. Examples of the monocyclic alicyclic group include a cyclopropyl group, a cyclobutyl group, a cyclopentyl group, a cyclohexyl group, a cycloheptyl group, a cyclooctyl group, and the like. In addition, examples of the polycyclic alicyclic group include a norbornyl group, an isobornyl group, a tricyclononyl group, a tricyclodecyl group, a tetracyclododecyl group, and the like. In addition, the hydrogen atom of these alicyclic groups may be substituted with an alkyl group, an alkoxy group, a hydroxyl group, or the like.

In the case of a group having an epoxy group or an alicyclic epoxy group and a divalent linking group, an epoxy group or an alicyclic epoxy group is preferably bonded via a divalent linking group bonded to an oxygen atom (—O—) in the formula.

Here, the divalent linking group is not particularly limited, but preferable examples thereof include a divalent hydrocarbon group which may have a substituent, a divalent linking group which includes a hetero atom, and the like.

Regarding the divalent hydrocarbon group which may have a substituent: the hydrocarbon group in such a divalent hydrocarbon group may be an aliphatic hydrocarbon group, or may be an aromatic hydrocarbon group.

The aliphatic hydrocarbon group as the divalent hydrocarbon group may be saturated or may be unsaturated, and is usually preferably saturated.

More specifically, the aliphatic hydrocarbon group may be a linear or branched aliphatic hydrocarbon group or an aliphatic hydrocarbon group including a ring in the structure and the like.

The linear aliphatic hydrocarbon group preferably has 1 to 10 carbon atoms, more preferably 1 to 6 carbon atoms, even more preferably 1 to 4 carbon atoms, and most preferably 1 to 3 carbon atoms. As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], a pentamethylene group [—$(CH_2)_5$—], and the like.

The branched aliphatic hydrocarbon group preferably has 2 to 10 carbon atoms, more preferably 2 to 6 carbon atoms, even more preferably 2 to 4 carbon atoms, and most preferably 2 or 3 carbon atoms. The branched aliphatic hydrocarbon group is preferably a branched alkylene group, and specific examples thereof include alkylalkylene groups such as alkyl methylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkyl ethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—, alkyltrimethylene groups such as —$CH(CH_3)CH_2CH_2$—, and —$CH_2CH(CH_3)CH_2$—, and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

Examples of the aliphatic hydrocarbon group including a ring in the structure include an alicyclic hydrocarbon group (a group in which two hydrogen atoms are removed from an aliphatic hydrocarbon ring), a group in which an alicyclic hydrocarbon group is bonded to the terminal of a linear or branched aliphatic hydrocarbon group, and a group in which an alicyclic hydrocarbon group is interposed in the middle of a linear or branched aliphatic hydrocarbon group. Examples of the linear or branched aliphatic hydrocarbon group include the same examples.

The alicyclic hydrocarbon group preferably has 3 to 20 carbon atoms, and more preferably 3 to 12 carbon atoms.

The alicyclic hydrocarbon group may be a polycyclic group or a monocyclic group. The monocyclic alicyclic hydrocarbon group is preferably a group in which two hydrogen atoms are removed from a monocycloalkane. Monocycloalkanes having 3 to 6 carbon atoms are preferable, and specific examples thereof include cyclopentane and cyclohexane.

As the polycyclic alicyclic hydrocarbon group, a group in which two hydrogen atoms are removed from a polycycloalkane is preferable, and the polycycloalkane preferably has 7 to 12 carbon atoms and specific examples thereof include adamantane, norbornane, isobornane, tricyclodecane, tetracyclododecane, and the like.

The aromatic hydrocarbon group in the divalent hydrocarbon group is a hydrocarbon group having at least one aromatic ring. This aromatic ring is not particularly limited as long as the aromatic ring is a cyclic conjugated system having (4n+2) π electrons, and may be monocyclic or polycyclic. The number of carbon atoms of the aromatic ring is preferably 5 to 30, more preferably 5 to 20, even more preferably 6 to 15, and particularly preferably 6 to 12. Specific examples of the aromatic ring include aromatic hydrocarbon rings such as benzene, naphthalene, anthracene, phenanthrene and the like; aromatic heterocyclic rings in which a part of the carbon atoms forming the aromatic hydrocarbon ring are substituted with hetero atoms and the like. Examples of the hetero atom in the aromatic heterocyclic ring include an oxygen atom, a sulfur atom, a nitrogen atom, and the like. Specific examples of the aromatic heterocyclic ring include a pyridine ring, a thiophene ring, and the like.

Specific examples of the aromatic hydrocarbon group include a group (arylene group or heteroarylene group) in which two hydrogen atoms are removed from the aromatic hydrocarbon ring or the aromatic heterocyclic ring; a group in which two hydrogen atoms are removed from an aromatic compound including two or more aromatic rings (for example, biphenyl, fluorene, and the like); a group in which one hydrogen atom of a group (an aryl group or a heteroaryl group) in which one hydrogen atom is removed from the aromatic hydrocarbon ring or the aromatic heterocyclic ring is substituted with an alkylene group (for example, a group in which one more hydrogen atom is removed from an aryl group in an arylalkyl group such as a benzyl group, a phenethyl group, a 1-naphthylmethyl group, a 2-naphthylmethyl group, a 1-naphthylethyl group, a 2-naphthylethyl group, and the like), and the like. The number of carbon atoms of the alkylene group bonded to the aryl group or the heteroaryl group is preferably 1 to 4, more preferably 1 to 2, and particularly preferably 1.

The divalent hydrocarbon group may have a substituent.

The linear or branched aliphatic hydrocarbon group as the divalent hydrocarbon group may or may not have a substituent. Examples of the substituent include a fluorine atom, a fluorinated alkyl group having 1 to 5 carbon atoms substituted with a fluorine atom, a carbonyl group, and the like.

The alicyclic hydrocarbon group in the aliphatic hydrocarbon group including a ring in the structure as a divalent hydrocarbon group may or may not have a substituent. Examples of the substituent include an alkyl group, an alkoxy group, a halogen atom, a halogenated alkyl group, a hydroxyl group, a carbonyl group, and the like.

The alkyl group as the substituent is preferably an alkyl group having 1 to 5 carbon atoms, and most preferably a methyl group, an ethyl group, a propyl group, an n-butyl group, or a tert-butyl group.

The alkoxy group as the substituent is preferably an alkoxy group having 1 to 5 carbon atoms, and is preferably a methoxy group, an ethoxy group, an n-propoxy group, an iso-propoxy group, an n-butoxy group or a tert-butoxy group, and a methoxy group and an ethoxy group are most preferable.

Examples of the halogen atom as the substituent include a fluorine atom, a chlorine atom, a bromine atom, an iodine atom, and the like, and a fluorine atom is preferable.

Examples of the halogenated alkyl group as the substituent include groups in which part or all of the hydrogen atoms of the alkyl group are substituted with the halogen atoms.

In the alicyclic hydrocarbon group, a part of the carbon atoms forming the ring structure may be substituted with a substituent including a hetero atom. The substituent including the hetero atom is preferably —O—, —C(=O)—O—, —S—, —S(=O)$_2$—, and —S(=O)$_2$—O—.

In the aromatic hydrocarbon group as the divalent hydrocarbon group, the hydrogen atom of the aromatic hydrocarbon group may be substituted with a substituent. For example, a hydrogen atom bonded to an aromatic ring in the aromatic hydrocarbon group may be substituted with a substituent. Examples of the substituent include an alkyl group, an alkoxy group, a halogen atom, a halogenated alkyl group, a hydroxyl group, and the like.

The alkyl group as the substituent is preferably an alkyl group having 1 to 5 carbon atoms, and most preferably a methyl group, an ethyl group, a propyl group, an n-butyl group, or a tert-butyl group.

Examples of the alkoxy group, halogen atom, and halogenated alkyl group as the substituent include those exemplified as the substituent for substituting the hydrogen atom of the alicyclic hydrocarbon group.

Regarding the divalent linking group including a hetero atom: the hetero atom in the divalent linking group including a hetero atom is an atom other than a carbon atom and a hydrogen atom, and examples thereof include an oxygen atom, a nitrogen atom, a sulfur atom, a halogen atom, and the like.

Preferable examples of the linking group in the divalent linking group containing a hetero atom include —O—, —C(=O)—O—, —C(=O)—, —O—C(=O)—O—; —C(=O)—NH—, —NH—, —NH—C(=O)—O—, —NH—C(=NH)— (H may be substituted with a substituent such as an alkyl group or an acyl group.); a group represented by —S—, —S(=O)$_2$—, —S(=O)$_2$—O—, general formula —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m''}$—Y$^{22}$— or —Y$^{21}$—O—C(=O)—Y$^{22}$— [in the formula, Y$^{21}$ and Y$^{22}$ are each independently a divalent hydrocarbon group which may have a substituent, O is an oxygen atom, and m" is an integer of 0 to 3.], and the like.

In the case where the divalent linking group including the hetero atom is —C(=O)—NH—, —NH—, —NH—C(=O)—O—, or —NH—C(=NH)—, H may be substituted with a substituent such as an alkyl group, an acyl, or the like. The substituent (alkyl group, acyl group, and the like) preferably has 1 to 10 carbon atoms, more preferably 1 to 8 carbon atoms, and particularly preferably 1 to 5 carbon atoms.

In formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$— or —Y$^{21}$—O—C(=O)—Y$^{22}$—, Y$^{21}$ and Y$^{22}$ are each independently a divalent hydrocarbon group which may have a substituent. Examples of the divalent hydrocarbon group include the same groups as the "divalent hydrocarbon group which may have a substituent" described as the divalent linking group.

As Y$^{21}$, a linear aliphatic hydrocarbon group is preferable, a linear alkylene group is more preferable, and a linear alkylene group having 1 to 5 carbon atoms is even more preferable, and a methylene group or an ethylene group is particularly preferable.

Y$^{22}$ is preferably a linear or branched aliphatic hydrocarbon group, and more preferably a methylene group, an ethylene group or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group. In the group represented by the formula —[Y$^{21}$—C(=O)—O]$_{m''}$—Y$^{22}$—, m" is an integer of 0 to 3, preferably an integer of 0 to 2, more preferably 0 or 1, and particularly preferably 1. That is, the group represented by the formula —[Y$^{21}$—C(=O)—O]$_{m''}$—Y$^{22}$— is particularly preferably a group represented by the formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, even more preferably 1 or 2, and most preferably 1. b' is an integer of 1 to 10, preferably an integer of 1 to 8, more preferably an integer of 1 to 5, even more preferably 1 or 2, and most preferably 1.

Among these, as the epoxy group-containing group in R$^{EP}$, a glycidyl group is preferable.

In addition, as the novolac type epoxy resin (Anv), it is possible to suitably use a resin including a constituent unit represented by general formula (anv1).

[Chemical formula 3]

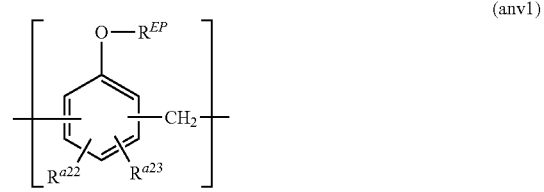

(anv1)

[In the formula, R$^{EP}$ is an epoxy group-containing group, and R$^{a22}$ and R$^{a23}$ are each independently a hydrogen atom, an alkyl group having 1 to 5 carbon atoms, or a halogen atom.]

In formula (anv1), the alkyl group having 1 to 5 carbon atoms of R$^{a22}$ and R$^{a23}$ is the same as the alkyl group having 1 to 5 carbon atoms of R$^{a11}$ and R$^{a12}$ in formula (anv0). The halogen atom of R$^{a22}$ and R$^{a23}$ is preferably a chlorine atom or a bromine atom.

In formula (anv1), R$^{EP}$ is the same as R$^{EP}$ in formula (anv0), and a glycidyl group is preferable.

Specific examples of the constituent unit represented by formula (anv1) are shown below.

[Chemical formula 4]

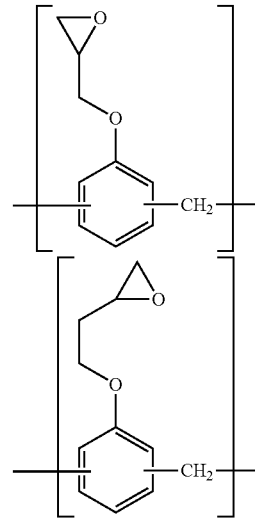

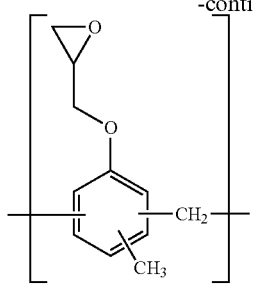

The novolac type epoxy resin (Anv) may be a resin formed only of the constituent unit (anv1), but a resin having a constituent unit (anv1) and another structural unit is also preferable. Examples of other constituent units include constituent units represented by each of general formulae (anv2) to (anv3).

[Chemical formula 5]

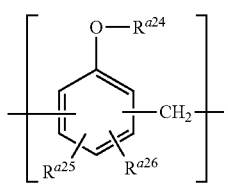
(anv2)

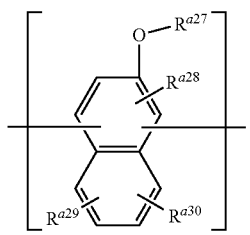
(anv3)

[In the formula, $R^{a24}$ is a hydrocarbon group which may have a substituent, $R^{a25}$, $R^{a26}$, and $R^{a28}$ to $R^{a30}$ are each independently a hydrogen atom, an alkyl group having 1 to 5 carbon atoms, or a halogen atom, and $R^{a27}$ is an epoxy group-containing group or a hydrocarbon group which may have a substituent.]

In formula (anv2), $R^{a24}$ is a hydrocarbon group which may have a substituent. Examples of the hydrocarbon group which may have a substituent include a linear or branched alkyl group and a cyclic hydrocarbon group.

The linear alkyl group preferably has 1 to 5 carbon atoms, more preferably 1 to 4 carbon atoms, and even more preferably 1 or 2 carbon atoms. Specific examples thereof include a methyl group, an ethyl group, an n-propyl group, an n-butyl group, an n-pentyl group and the like. Among these, a methyl group, an ethyl group, or an n-butyl group is preferable, and a methyl group or an ethyl group is more preferable.

The branched alkyl group preferably has 3 to 10 carbon atoms, more preferably 3 to 5 carbon atoms. Specific examples thereof include an isopropyl group, an isobutyl group, a tert-butyl group, an isopentyl group, a neopentyl group, a 1,1-diethylpropyl group, a 2,2-dimethylbutyl group, and the like, and an isopropyl group is preferable.

In the case where $R^{a24}$ is a cyclic hydrocarbon group, the hydrocarbon group may be an aliphatic hydrocarbon group or an aromatic hydrocarbon group, and may be a polycyclic group or a monocyclic group.

The aliphatic hydrocarbon group which is a monocyclic group is preferably a group in which one hydrogen atom are removed from a monocycloalkane. Monocycloalkanes having 3 to 6 carbon atoms are preferable, and specific examples thereof include cyclopentane and cyclohexane.

As the aliphatic hydrocarbon group which is a polycyclic group, a group in which one hydrogen atom is removed from a polycycloalkane is preferable, and the polycycloalkane preferably has 7 to 12 carbon atoms, and specific examples thereof include adamantane, norbornane, isobornane, tricyclodecane, tetracyclododecane, and the like.

In the case where the cyclic hydrocarbon group of $R^{a24}$ is an aromatic hydrocarbon group, the aromatic hydrocarbon group is a hydrocarbon group having at least one aromatic ring.

This aromatic ring is not particularly limited as long as it is a cyclic conjugated system having $4n+2\pi$ electrons, and may be monocyclic or polycyclic. The number of carbon atoms of the aromatic ring is preferably 5 to 30, more preferably 5 to 20, even more preferably 6 to 15, and particularly preferably 6 to 12. Specific examples of the aromatic ring include aromatic hydrocarbon rings such as benzene, naphthalene, anthracene, phenanthrene, and the like; aromatic heterocyclic rings in which a part of the carbon atoms forming the aromatic hydrocarbon ring is substituted with hetero atoms and the like. Examples of the hetero atom in the aromatic heterocyclic ring include an oxygen atom, a sulfur atom, a nitrogen atom, and the like. Specific examples of the aromatic heterocyclic ring include a pyridine ring, a thiophene ring, and the like.

Specific examples of the aromatic hydrocarbon group in $R^{a24}$ include a group (an aryl group or a heteroaryl group) in which one hydrogen atom is removed from the aromatic hydrocarbon ring or the aromatic heterocyclic ring; a group in which one hydrogen atom is removed from an aromatic compound having two or more aromatic rings (for example, biphenyl, fluorene, and the like.); a group in which one hydrogen atom of the aromatic hydrocarbon ring or aromatic heterocyclic ring is substituted with an alkylene group (for example, an arylalkyl group such as a benzyl group, a phenethyl group, a 1-naphthylmethyl group, a 2-naphthylmethyl group, a 1-naphthylethyl group, a 2-naphthylethyl group, and the like), and the like. The number of carbon atoms of the alkylene group bonded to the aromatic hydrocarbon ring or the aromatic heterocyclic ring is preferably 1 to 4, more preferably 1 to 2, and particularly preferably 1.

In formulae (anv2) and (anv3), $R^{a25}$, $R^{a26}$ and $R^{a28}$ to $R^{a30}$ are each independently a hydrogen atom, an alkyl group having 1 to 5 carbon atoms, or a halogen atom, and the alkyl group having 1 to 5 carbon atoms and the halogen atoms are the same as $R^{a22}$ and $R^{a23}$, respectively.

In formula (anv3), $R^{a27}$ is an epoxy group-containing group or a hydrocarbon group which may have a substituent. The epoxy group-containing group of $R^{a27}$ is the same as $R^{EP}$ in formula (anv0), and the hydrocarbon group which may have a substituent of $R^{a27}$ is the same that of as $R^{a24}$.

Specific examples of the constituent units represented by formulae (anv2) and (anv3) are shown below.

[Chemical formula 6]

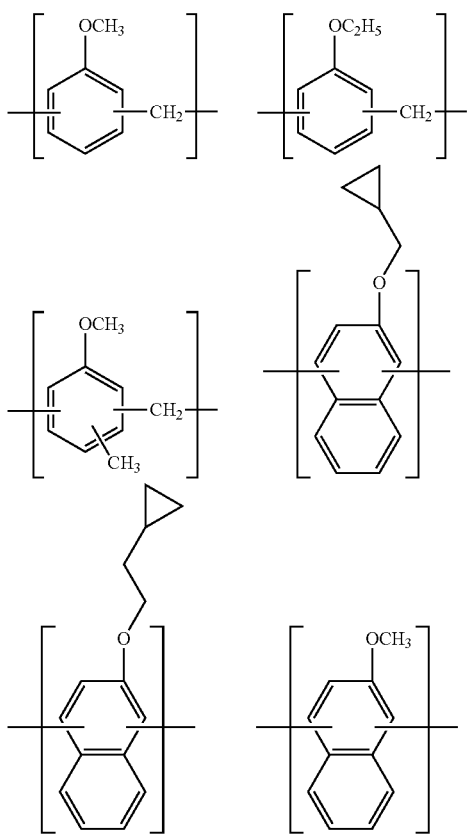

In the case where the novolac type epoxy resin (Anv) has other constituent units in addition to the constituent unit (anv1), the ratio of each constituent unit in the resin (Anv) is not particularly limited, but the total of the constituent units having an epoxy group with respect to the total of the constituent units forming the resin (Anv) is preferably 10 mol % to 90 mol %, more preferably 20 mol % to 80 mol %, and even more preferably 30 mol % to 70 mol %.

[Bisphenol A Type Epoxy Resin (Abp)]

As the bisphenol A type epoxy resin (Abp), it is possible to use an epoxy resin having a structure represented by general formula (abp1).

$R^{EP}$ is the same as $R^{EP}$ in formula (anv0), and a glycidyl group is preferable.

[Aliphatic Epoxy Resin and Acryl Resin (Aac)]

As the aliphatic epoxy resin and the acrylic resin (Aac), it is possible to use a resin including epoxy group-containing units represented by general formulae (a1-1) and (a1-2).

[Chemical formula 8]

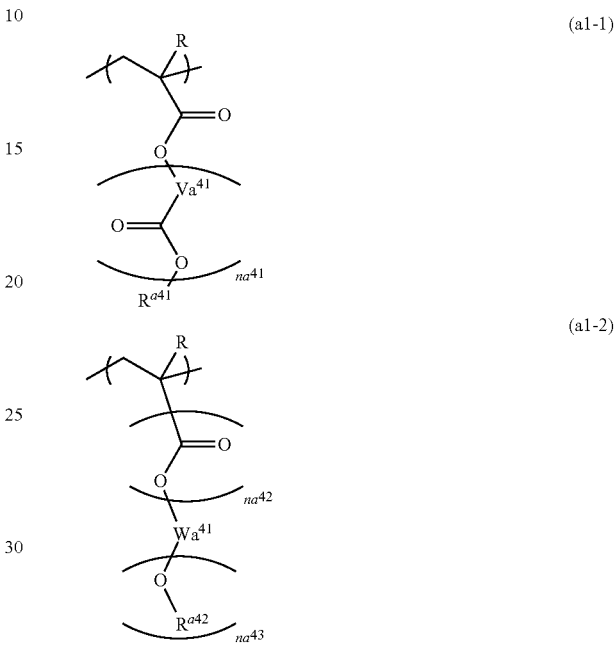

[In the formulae, R is a hydrogen atom, an alkyl group having 1 to 5 carbon atoms, or a halogenated alkyl group having 1 to 5 carbon atoms, $Va^{41}$ is a divalent hydrocarbon group which may have a substituent, $na^{41}$ is an integer of 0 to 2, $R^{a41}$ and $R^{a42}$ are epoxy group-containing groups, $na^{42}$ is 0 or 1, $Wa^{41}$ is a ($na^{43}$+1)-valent hydrocarbon group, and $na^{43}$ is an integer of 1 to 3.]

In formula (a1-1), R is a hydrogen atom, an alkyl group having 1 to 5 carbon atoms, or a halogenated alkyl group having 1 to 5 carbon atoms.

The alkyl group having 1 to 5 carbon atoms of R is preferably linear or branched, and specific examples thereof

[Chemical formula 7]

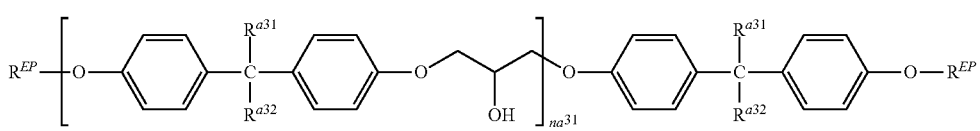

[In the formula, $R^{EP}$ is an epoxy group-containing group, $R^{a31}$ and $R^{a32}$ are each independently a hydrogen atom or an alkyl group having 1 to 5 carbon atoms, and $na^{31}$ is an integer of 1 to 50.]

In formula (abp1), the alkyl group having 1 to 5 carbon atoms of $R^{a31}$ and $R^{a32}$ is the same as the alkyl group having 1 to 5 carbon atoms of $R^{a11}$ and $R^{a12}$ in formula (anv0). Among these, as $R^{a31}$ and $R^{a32}$, a hydrogen atom or a methyl group is preferable.

include a methyl group, an ethyl group, a propyl group, an isopropyl group, an n-butyl group, an isobutyl group, a tert-butyl group, a pentyl group, an isopentyl group, a neopentyl group, and the like.

The halogenated alkyl group having 1 to 5 carbon atoms of R is a group in which part or all of the hydrogen atoms of the alkyl group having 1 to 5 carbon atoms are substituted with a halogen atom. Examples of the halogen atom include a fluorine atom, a chlorine atom, a bromine atom, an iodine atom, and the like, and a fluorine atom is particularly preferable.

As R, a hydrogen atom, an alkyl group having 1 to 5 carbon atoms, or a fluorinated alkyl group having 1 to 5 carbon atoms is preferable, and from the viewpoint of industrial availability, a hydrogen atom or a methyl group is most preferable.

In formula (a1-1), $Va^{41}$ is a divalent hydrocarbon group which may have a substituent and examples thereof include the same groups as the divalent hydrocarbon group which may have a substituent as described in $R^{EP}$ in formula (anv0).

In the description, the hydrocarbon group of $Va^{41}$ is preferably an aliphatic hydrocarbon group, more preferably a linear or branched aliphatic hydrocarbon group, even more preferably a linear aliphatic hydrocarbon group, and particularly preferably a linear alkylene group.

In formula (a1-1), $na^{41}$ is an integer of 0 to 2, and preferably 0 or 1.

In Formulae (a1-1) and (a1-2), $R^{a41}$ and $R^{a42}$ are epoxy group-containing groups and are the same as $R^{EP}$ in formula (anv0).

In formula (a1-2), the $(na^{43}+1)$-valent hydrocarbon group in $Wa^{41}$ may be an aliphatic hydrocarbon group or may be an aromatic hydrocarbon group. The aliphatic hydrocarbon group means a hydrocarbon group having no aromaticity, which may be saturated or unsaturated, and is usually preferably saturated. As the aliphatic hydrocarbon group, a linear or branched aliphatic hydrocarbon group, an aliphatic hydrocarbon group including a ring in the structure, or a group combining a linear or branched aliphatic hydrocarbon group and an aliphatic hydrocarbon group including a ring in the structure is exemplified.

In formula (a1-2), $na^{43}$ is an integer of 1 to 3, preferably 1 or 2.

Specific examples of the structural unit represented by formula (a1-1) or (a1-2) are shown below.

[Chemical formula 9]

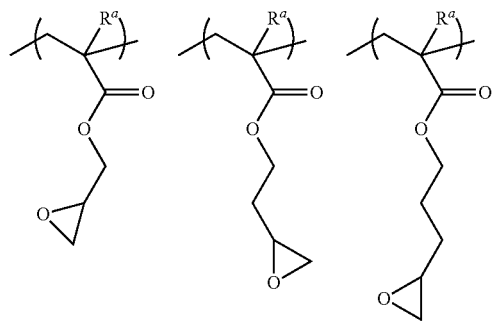

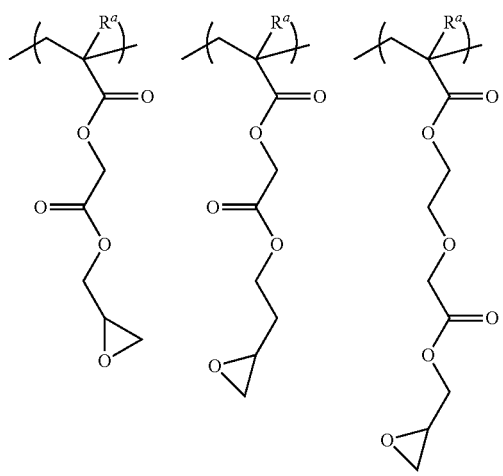

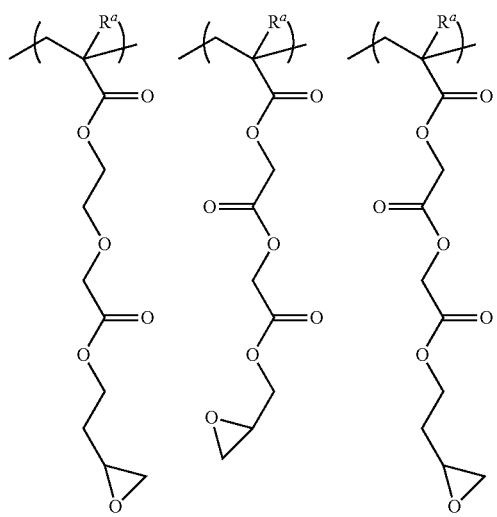

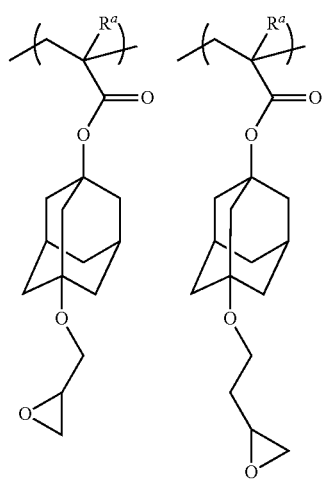

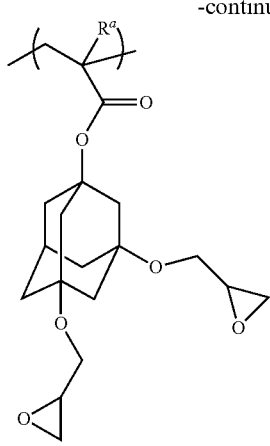
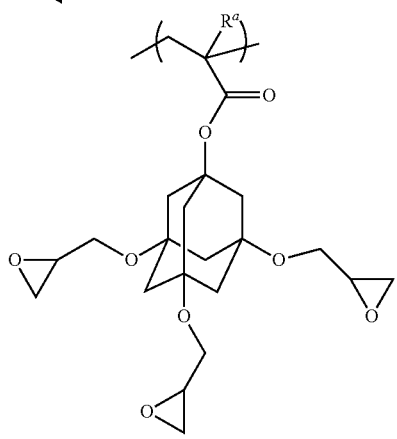
[Chemical formula 10]
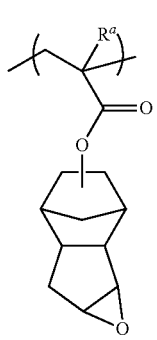 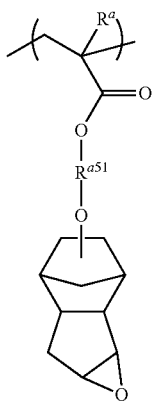 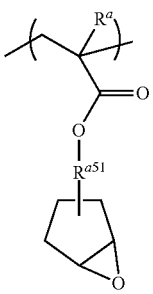
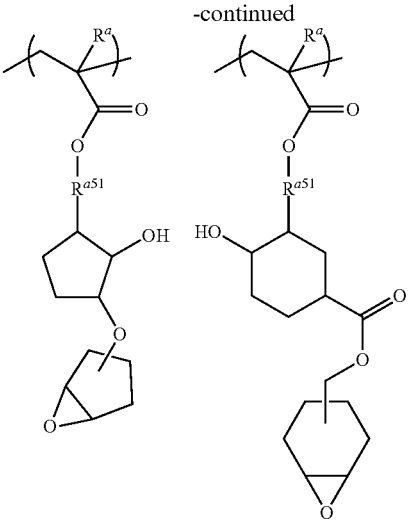
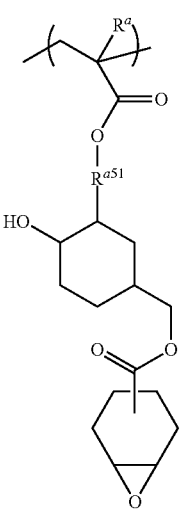 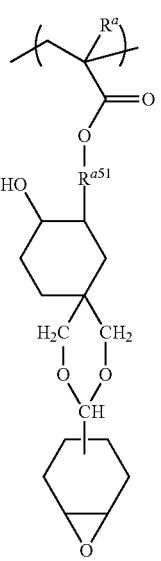

[Chemical formula 11]
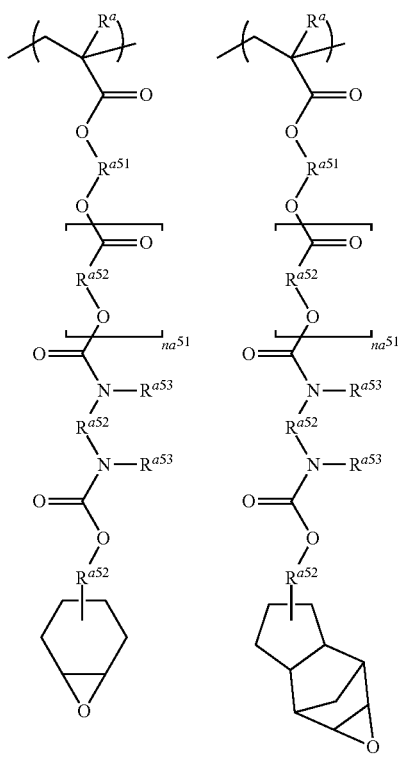
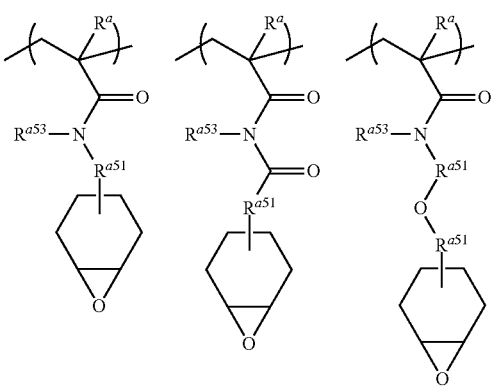
[Chemical formula 12]
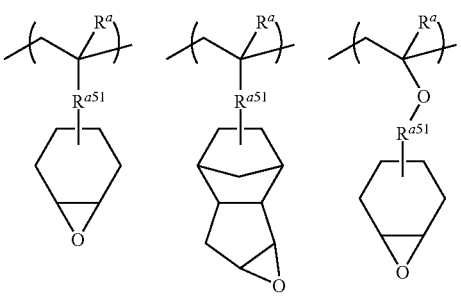
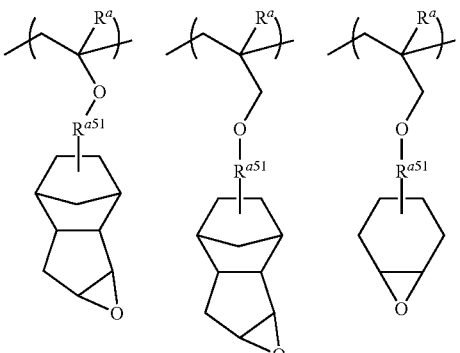
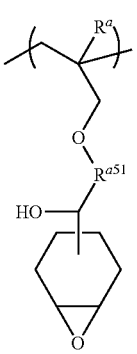

[Chemical formula 13]

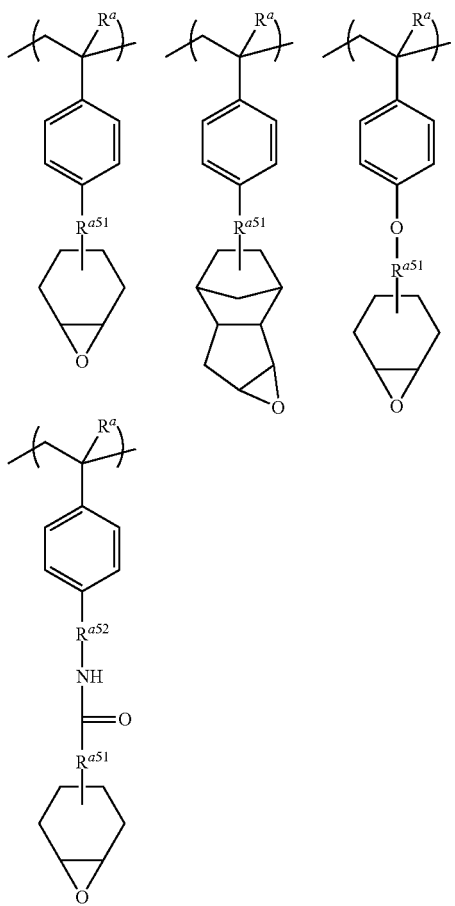

In the formulae, $R^a$ represents a hydrogen atom, a methyl group, or a trifluoromethyl group, $R^{a51}$ represents a divalent hydrocarbon group having 1 to 8 carbon atoms, $R^{a52}$ represents a divalent hydrocarbon group having 1 to 20 carbon atoms, and $R^{a53}$ represents a hydrogen atom or a methyl group. $na^{51}$ is an integer of 0 to 10.

$R^{a51}$, $R^{a52}$, and $R^{a53}$ may be the same as or different from each other.

Furthermore, it is possible for the acrylic resin (Aac) to include other polymerizable compounds as a constituent unit for the purpose of suitably controlling the physical and chemical properties. As such a polymerizable compound, examples include a known radical polymerizable compound or anion polymerizable compound. In addition, examples of such a polymerizable compound include monocarboxylic acids such as acrylic acid, methacrylic acid, and crotonic acid; dicarboxylic acids such as maleic acid, fumaric acid, itaconic acid, and the like; methacrylic acid derivatives having a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth) acrylic acid alkyl esters such as methyl (meth)acrylate, ethyl (meth)acrylate, and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate, and benzyl (meth) acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile, and methacryloylnitrile; chlorine-containing polymerizable compounds such as vinyl chloride and vinylidene chloride; amide bond-containing polymerizable compounds such as acrylamide and methacrylamide, and the like.

In the case where the aliphatic epoxy resin and the acrylic resin (Aac) have other constituent units, the content ratio of the epoxy group-containing unit in the resin is preferably 5 mol % to 40 mol %. The content ratio is more preferably 10 mol % to 30 mol %, and most preferably 15 mol % to 25 mol %.

As the component (A), one type may be used alone, or two or more types may be used in combination.

In addition, it is also possible to use any one or more of novolac type epoxy resin (Anv), bisphenol A type resin (Abp), aliphatic epoxy resin, and acrylic resin (Aac) in combination.

Among these, the component (A) more preferably contains one or more types of resins selected from the group consisting of a novolac type epoxy resin (Anv), a bisphenol A type epoxy resin (Abp), and a bisphenol F type epoxy resin since the effect of the present invention is more easily obtained.

In particular, from the viewpoint of resistance to pattern collapse, the component (A) more preferably contains one or more types of resins selected from the group consisting of a novolac type epoxy resin (Anv) and a bisphenol A type epoxy resin (Abp).

The mass average molecular weight in terms of polystyrene of the component (A) is preferably 100 to 300,000, more preferably 200 to 200,000, and even more preferably 300 to 200,000. Setting such a mass average molecular weight makes it possible to maintain sufficient strength in the formed film without decreasing releasability from the support, and also to prevent the swelling of the profile and the occurrence of cracks at the time of plating.

In addition, the component (A) is preferably a resin having a dispersivity of 1.05 or more. Here, the dispersivity is a value obtained by dividing the mass average molecular weight by the number average molecular weight. Setting such a dispersivity makes it possible to obtain desired stress resistance to a plating and to avoid the problem that the metal layer obtained by the plating process swells easily.

In the photosensitive composition of the present invention, the content of the component (A) may be adjusted according to the film thickness to be formed or the like.

<Cationic Polymerization Initiator (B): Component (B)>

In the present invention, the cationic polymerization initiator (B) has one or more types of cationic polymerization initiator (B0) (referred to below as "component (B0)") selected from the group consisting of a compound represented by general formula (b0-1) and a compound represented by general formula (b0-2), and a cationic polymerization initiator (B1) (referred to below as "component (B1)") which generates an acid with a pKa of −3 or more.

[Chemical formula 14]

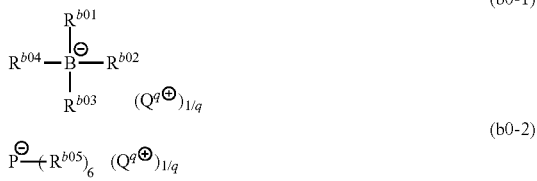

[In the formulae, $R^{b01}$ to $R^{b04}$ are each independently a fluorine atom or an aryl group which may have a substituent, $R^{b05}$ is a fluorine atom or a fluorinated alkyl group which may have a substituent, plural $R^{b05}$'s may be the same as or different from each other, q is an integer of 1 or more, and $Q^{q+}$'s are each independently a q-valent organic cation.]

[Component (B0)]

The component (B0) is one or more types of cationic polymerization initiators selected from the group consisting of the compound represented by general formula (b0-1) and the compound represented by general formula (b0-2). Since these two types of compounds generate a comparatively strong acid upon exposure, in the case where a pattern is formed using a negative photosensitive composition having the component (B0), it is possible to obtain sufficient sensitivity and a good pattern is obtained.

In formula (b0-1), $R^{b01}$ to $R^{b04}$ are each independently a fluorine atom or an aryl group which may have a substituent.

The aryl group which may have a substituent of $R^{b01}$ to $R^{b04}$ preferably has 5 to 30 carbon atoms, more preferably 5 to 20, even more preferably 6 to 15, and particularly preferably 6 to 12 carbon atoms. Specific examples thereof include a naphthyl group, a phenyl group, an anthracenyl group, and the like and a phenyl group is preferable since it is easy to obtain.

The aryl group may have a substituent. The substituent is not particularly limited but is preferably a halogen atom, a hydroxyl group, a hydrocarbon group (preferably a linear or branched alkyl group, and preferably having 1 to 5 carbon atoms), more preferably a halogen atom or a halogenated alkyl group having 1 to 5 carbon atoms, and particularly preferably a fluorine atom or a fluorinated alkyl group having 1 to 5 carbon atoms. Since the aryl group has a fluorine atom, the polarity of the anion moiety is increased, which is preferable.

Among these, as $R^{b01}$ to $R^{b04}$ of formula (b0-1), a fluorinated phenyl group is preferable, and a perfluorophenyl group is particularly preferable.

Preferable specific examples of the anion moiety of the compound represented by formula (b0-1) include tetrakis(pentafluorophenyl)borate ($[B(C_6F_5)_4]^-$); tetrakis[(trifluoromethyl)phenyl]borate ($[B(C_6H_4CF_3)_4]^-$); diifluorobis(pentafluorophenyl)borate ($[(C_6F_5)_2BF_2]^-$); triifluoro(pentafluorophenyl)borate ($[(C_6F_5)BF_3]^-$); tetrakis(difluorophenyl)borate ($[B(C_6H_3F_2)_4]^-$), and the like. Among these, tetrakis(pentafluorophenyl)borate ($[B(C_6F_5)_4]^-$) is particularly preferable.

In formula (b0-2), $R^{b05}$ is a fluorine atom or a fluorinated alkyl group which may have a substituent, and plural $R^{b05}$'s may be the same as or different from each other.

The fluorinated alkyl group which may have a substituent of $R^{b05}$ preferably has 1 to 10 carbon atoms, more preferably 1 to 8 carbon atoms, and even more preferably 1 to 5 carbon atoms. Specifically, in the alkyl group having 1 to 5 carbon atoms in the description of $R^{a22}$ and $R^{a23}$, examples thereof include a group in which a part or all of the hydrogen atoms are substituted with a fluorine atom.

Among these, $R^{b05}$ is preferably a fluorine atom or a fluorinated alkyl group having 1 to 5 carbon atoms, more preferably a fluorine atom or a perfluoroalkyl group having 1 to 5 carbon atoms, and even more preferably a fluorine atom, a trifluoromethyl group, or a pentafluoroethyl group.

The anion moiety of the compound represented by formula (b0-2) is preferably represented by general formula (b0-2a).

[Chemical formula 15]

[In the formula, $R^{bf05}$ is a fluorinated alkyl group which may have a substituent, and $nb^1$ is an integer of 1 to 5.]

In formula (b0-2a), the fluorinated alkyl group which may have a substituent of $R^{bf05}$ is the same as the fluorinated alkyl group which may have a substituent described in $R^{b05}$.

In formula (b0-2a), $nb^1$ is preferably 1 to 4, more preferably 2 to 4, and most preferably 3.

In formulae (b0-1) to (b0-2), q is an integer of 1 or more, $Q^{q+}$ is a q-valent organic cation, preferably a sulfonium cation or an iodonium cation, and organic cations respectively represented by general formulae (ca-1) to (ca-5) are particularly preferable.

[Chemical formula 16]

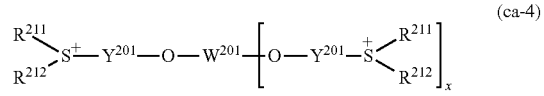

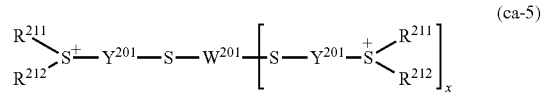

[In the formulae, $R^{201}$ to $R^{207}$, $R^{211}$, and $R^{212}$ each independently represent an aryl group which may have a substituent, a heteroaryl group, an alkyl group, or an alkenyl group, and $R^{201}$ to $R^{203}$, $R^{206}$, $R^{207}$, $R^{211}$ and $R^{212}$ may be bonded to each other to form a ring with the sulfur atom in the formula. $R^{206}$ and $R^{209}$ each independently represent a hydrogen atom or an alkyl group having 1 to 5 carbon atoms, $R^{210}$ is an aryl group which may have a substituent, an alkyl group which may have a substituent, an alkenyl group which may have a substituent, or an —$SO_2$— containing cyclic group which may have a substituent, $L^{201}$ represents —C(=O)— or —C(=O)—O—, $Y^{201}$'s each independently represent an arylene group, an alkylene group, or an alkenylene group, x is 1 or 2, and $W^{201}$ represents a (x+1)-valent linking group.]

As the aryl group in $R^{201}$ to $R^{207}$, $R^{211}$, and $R^{212}$, examples thereof include an unsubstituted aryl group having 6 to 20 carbon atoms, and a phenyl group and a naphthyl group are preferable.

Examples of the heteroaryl group in $R^{201}$ to $R^{207}$, $R^{211}$, and $R^{212}$ include groups in which part of the carbon atoms forming the aryl group is substituted with a hetero atom.

Examples of the hetero atom include an oxygen atom, a sulfur atom, a nitrogen atom, and the like. Examples of the heteroaryl group include a group in which one hydrogen atom is removed from 9H-thioxanthene; and as a substituted heteroaryl group, examples include a group in which one hydrogen atom is removed from 9H-thioxanthen-9-one.

The alkyl group in $R^{201}$ to $R^{207}$, $R^{211}$, and $R^{212}$ is a chain or cyclic alkyl group preferably having 1 to 30 carbon atoms.

The alkenyl group in $R^{201}$ to $R^{207}$, $R^{211}$, and $R^{212}$ preferably has 2 to 10 carbon atoms.

Examples of the substituent which $R^{201}$ to $R^{207}$, $R^{210}$, and $R^{212}$ may have include an alkyl group, a halogen atom, a halogenated alkyl group, a carbonyl group, a cyano group, an amino group, an oxo group (=O), an aryl group or groups represented by formulae (ca-r-1) to (ca-r-10), respectively.

[Chemical formua 17]

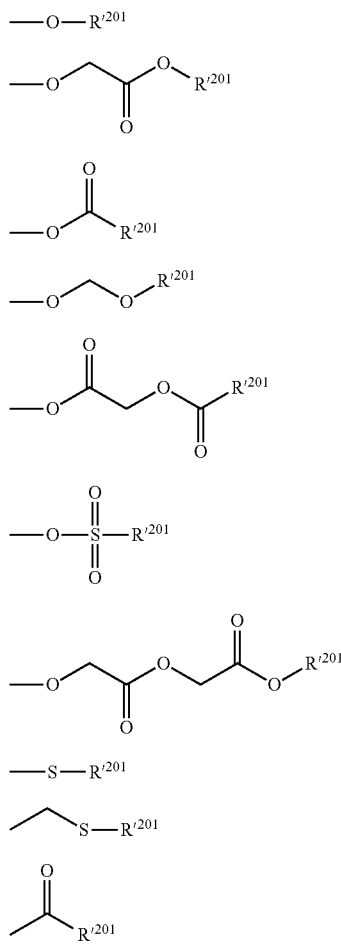

[ca-r-1]
[ca-r-2]
[ca-r-3]
[ca-r-4]
[ca-r-5]
[ca-r-6]
[ca-r-7]
[ca-r-8]
[ca-r-9]
[ca-r-10]

[In the formulae, $R'^{201}$'s are each independently a hydrogen atom, a cyclic group which may have a substituent, a chain alkyl group which may have a substituent, or a chain alkenyl group which may have a substituent.]

$R'^{201}$ is a cyclic group which may have a substituent, a chain alkyl group which may have a substituent, or a chain alkenyl group which may have a substituent.

Cyclic Group which May have a Substituent:

The cyclic group is preferably a cyclic hydrocarbon group, and the cyclic hydrocarbon group may be an aromatic hydrocarbon group, or may be an aliphatic hydrocarbon group. An aliphatic hydrocarbon group means a hydrocarbon group having no aromaticity. In addition, the aliphatic hydrocarbon group may be saturated or unsaturated, and is usually preferably saturated.

The aromatic hydrocarbon group in $R'^{201}$ is a hydrocarbon group having an aromatic ring. The number of carbon atoms in the aromatic hydrocarbon group is preferably 3 to 30, more preferably 5 to 30, even more preferably 5 to 20, particularly preferably 6 to 15, and most preferably 6 to 10. However, the number of carbon atoms in the substituent is not included in the number of carbon atoms.

Specific examples of the aromatic ring of the aromatic hydrocarbon group in $R'^{201}$ include benzene, fluorene, naphthalene, anthracene, phenanthrene, biphenyl, or an aromatic heterocyclic ring in which a part of the carbon atoms forming these aromatic rings is substituted with a hetero atom or a ring in which part of the hydrogen atoms forming the aromatic ring or the aromatic heterocyclic ring is substituted with an oxo group or the like. Examples of the hetero atom in the aromatic heterocyclic ring include an oxygen atom, a sulfur atom, a nitrogen atom, and the like.

Specific examples of the aromatic hydrocarbon group in $R'^{201}$ include a group (an aryl group, for example, a phenyl group, a naphthyl group, an anthracenyl group or the like) in which one hydrogen atom is removed from the aromatic ring, a group in which one hydrogen atom of an aromatic ring is substituted with an alkylene group (for example, an arylalkyl group such as a benzyl group, a phenethyl group, a 1-naphthylmethyl group, a 2-naphthylmethyl group, a 1-naphthylethyl group, a 2-naphthylethyl group, and the like), a group in which one hydrogen atom is removed from a ring (for example, anthraquinone or the like) in which part of the hydrogen atoms forming the aromatic ring is substituted with an oxo group, a group in which one hydrogen atom is removed from an aromatic heterocyclic ring (for example, 9H-thioxanthene, 9H-thioxanthene-9-one and the like), and the like. The number of carbon atoms of the alkylene group (alkyl chain in the arylalkyl group) is preferably 1 to 4, more preferably 1 to 2, and particularly preferably 1.

Examples of the cyclic aliphatic hydrocarbon group in $R'^{201}$ include an aliphatic hydrocarbon group having a ring in the structure thereof.

Examples of the aliphatic hydrocarbon group including a ring in this structure include an alicyclic hydrocarbon group (a group in which one hydrogen atom is removed from an aliphatic hydrocarbon ring), a group in which an alicyclic hydrocarbon group is bonded to the terminal of a linear or branched aliphatic hydrocarbon group, and a group in which an alicyclic hydrocarbon group is interposed in the middle of a linear or branched aliphatic hydrocarbon group, and the like.

The alicyclic hydrocarbon group preferably has 3 to 20 carbon atoms, and more preferably 3 to 12 carbon atoms.

The alicyclic hydrocarbon group may be a polycyclic group or a monocyclic group. The monocyclic alicyclic hydrocarbon group is preferably a group in which one or more hydrogen atoms are removed from a monocycloalkane. Monocycloalkanes having 3 to 6 carbon atoms are preferable, and specific examples thereof include cyclopentane and cyclohexane. The polycyclic alicyclic hydrocarbon group is preferably a group in which one or more hydrogen atoms are removed from a polycycloalkane, and the polycycloalkane preferably has 7 to 30 carbon atoms. Among these, as the polycycloalkane, a polycycloalkane having a bridged ring-type polycyclic skeleton such as adamantane, norbornane, isobornane, tricyclodecane and tetracyclododecane; or a polycycloalkane having a condensed ring type polycyclic skeleton such as a cyclic group having a steroid skeleton is more preferable.

Among these, the cyclic aliphatic hydrocarbon group in $R'^{201}$ is preferably a group in which one or more hydrogen atoms are removed from a monocycloalkane or polycycloalkane, more preferably a group in which one hydrogen atom is removed from a polycycloalkane, particularly preferably an adamantyl group or a norbornyl group, and most preferably an adamantyl group.

The linear or branched aliphatic hydrocarbon group which may be bonded to the alicyclic hydrocarbon group preferably has 1 to 10 carbon atoms, more preferably 1 to 6, even more preferably 1 to 4, and most preferably 1 to 3.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], a pentamethylene group [—$(CH_2)_5$—], and the like.

The branched aliphatic hydrocarbon group is preferably a branched alkylene group, and specific examples thereof include alkylalkylene groups such as alkyl methylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkyl ethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—, alkyltrimethylene groups such as —$CH(CH_3)CH_2CH_2$—, and —$CH_2CH(CH_3)CH_2$—, and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

Chain Alkyl Group which May have a Substituent:

The chain alkyl group of $R'^{201}$ may be either linear or branched.

The linear alkyl group preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, a docosyl group, and the like.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, a 4-methylpentyl group, and the like.

Chain Alkenyl Group which May have a Substituent:

The chain alkenyl group of $R'^{201}$ may be either linear or branched, and preferably has 2 to 10 carbon atoms, more preferably 2 to 5, even more preferably 2 to 4, and particularly preferably 3. Examples of the linear alkenyl group include a vinyl group, a propenyl group (allyl group), a butynyl group, and the like. Examples of branched alkenyl groups include a 1-methylvinyl group, a 2-methylvinyl group, a 1-methylpropenyl group, a 2-methylpropenyl group, and the like.

Among these, as the chain alkenyl group, a linear alkenyl group is preferable, a vinyl group and a propenyl group are more preferable, and a vinyl group is particularly preferable.

Examples of the substituent in the cyclic group, the chain alkyl group, or the alkenyl group of $R'^{201}$ include an alkoxy group, a halogen atom, a halogenated alkyl group, a hydroxyl group, a carbonyl group, a nitro group, an amino group, an oxo group, a cyclic group in $R'^{201}$, an alkylcarbonyl group, a thienylcarbonyl group, and the like.

Among these, $R'^{201}$ is preferably a cyclic group which may have a substituent or a chain alkyl group which may have a substituent.

In the case where $R^{201}$ to $R^{203}$, $R^{206}$, $R^{207}$, $R^{211}$, and $R^{212}$ are bonded to each other to form a ring with the sulfur atom in the formula, the bonding may be via a hetero atom such as a sulfur atom, an oxygen atom, a nitrogen atom or the like, or a functional group such as a carbonyl group, —SO—, —$SO_2$—, —$SO_3$—, —COO—, —CONH—, or —$N(R_N)$— ($R_N$ is an alkyl group having 1 to 5 carbon atoms). As the ring to be formed, one ring including a sulfur atom in the ring skeleton thereof in the formula is preferably a 3- to 10-membered ring, and particularly preferably a 5- to 7-membered ring including a sulfur atom. Specific examples of the formed ring include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring, a tetrahydrothiopyranium ring, and the like.

$R^{208}$ and $R^{209}$ each independently represent a hydrogen atom or an alkyl group having 1 to 5 carbon atoms, preferably a hydrogen atom or an alkyl group having 1 to 3 carbon atoms, and in the case of being an alkyl group, $R^{208}$ and $R^{209}$ may be bonded to each other to form a ring.

$R^{210}$ is an aryl group which may have a substituent, an alkyl group which may have a substituent, an alkenyl group which may have a substituent, or an —$SO_2$— containing cyclic group which may have a substituent.

Examples of the aryl group in $R^{210}$ include an unsubstituted aryl group having 6 to 20 carbon atoms, and a phenyl group and a naphthyl group are preferable.

The alkyl group in $R^{210}$ is a chain or cyclic alkyl group preferably having 1 to 30 carbon atoms.

The alkenyl group in $R^{210}$ preferably has 2 to 10 carbon atoms.

$Y^{201}$'s each independently represent an arylene group, an alkylene group, or an alkenylene group.

Examples of the arylene group in $Y^{201}$ include a group in which one hydrogen atom is removed from the aryl group exemplified as the aromatic hydrocarbon group in $R'^{201}$.

Examples of the alkylene group and alkenylene group in $Y^{201}$ include groups in which one hydrogen atom is removed from the groups exemplified as a chain alkyl group and a chain alkenyl group in $R'^{201}$.

In formula (ca-4), x is 1 or 2.

$W^{201}$ is (x+1)-valent, that is, a divalent or trivalent linking group.

The divalent linking group in $W^{201}$ is preferably a divalent hydrocarbon group which may have a substituent and is preferably the same group as the divalent hydrocarbon group which may have a substituent exemplified for $R^{EP}$ in formula (anv0). The divalent linking group in $W^{201}$ may be either linear, branched, or cyclic, and is preferably cyclic. Among these, a group formed by combining two carbonyl groups at both ends of an arylene group, or a group formed only of an arylene group is preferable. Examples of the arylene group include a phenylene group, a naphthylene group, and the like, and a phenylene group is particularly preferable.

Examples of the trivalent linking group in $W^{201}$ include a group in which one hydrogen atom is removed from the divalent linking group in $W^{201}$, a group in which the divalent linking group is further bonded to the divalent linking group, and the like. The trivalent linking group in $W^{201}$ is preferably a group in which two carbonyl groups are bonded to an arylene group.

Specific examples of suitable cations represented by formula (ca-1) include cations represented by formulae (ca-1-1) to (ca-1-24).

[Chemical formula 18]

(ca-1-1)

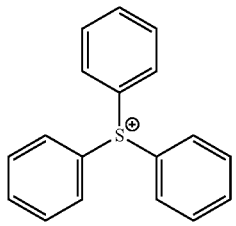

(ca-1-2)

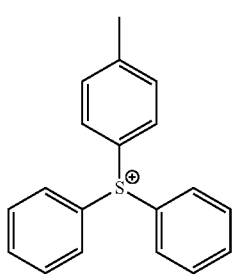

(ca-1-3)

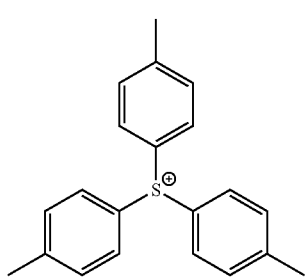

-continued (ca-1-4)

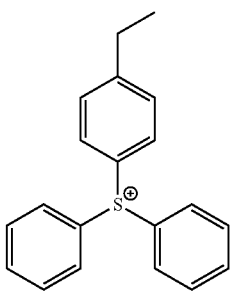

(ca-1-5)

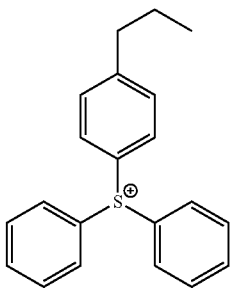

(ca-1-6)

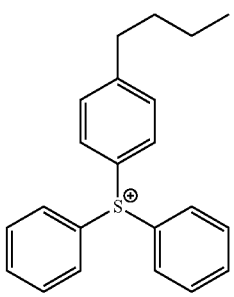

(ca-1-7)

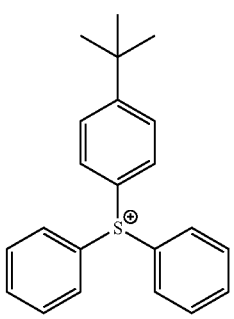

(ca-1-8)

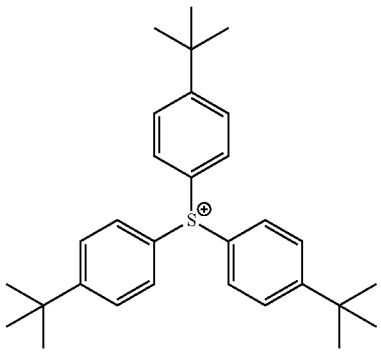

-continued
(ca-1-9)
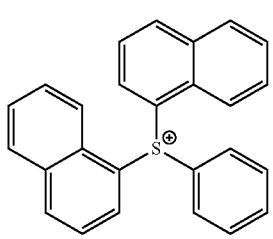
[Chemical formula 19]
(ca-1-10)
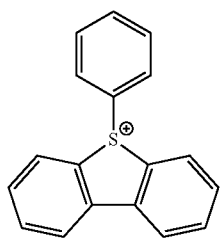
(ca-1-11)
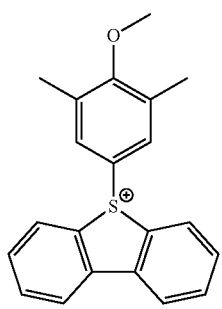
(ca-1-12)
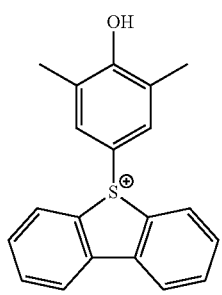
(ca-1-13)
(ca-1-14)
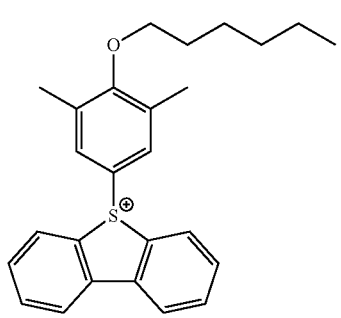
(ca-1-15)
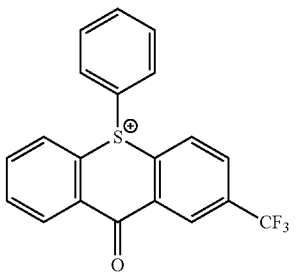
(ca-1-16)
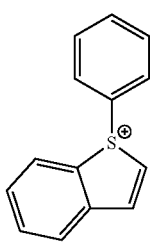
(ca-1-17)
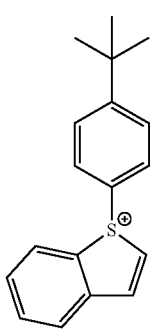
(ca-1-18)
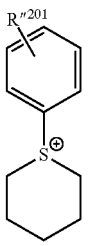
(ca-1-19)
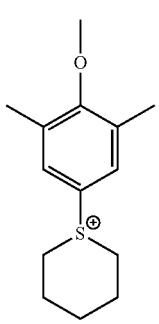

(ca-1-20)
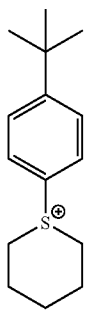
(ca-1-21)
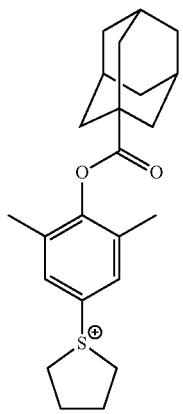
(ca-1-22)
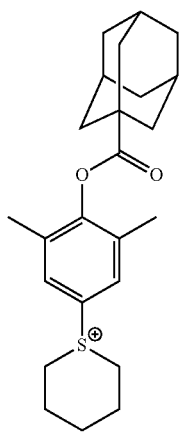
(ca-1-23)
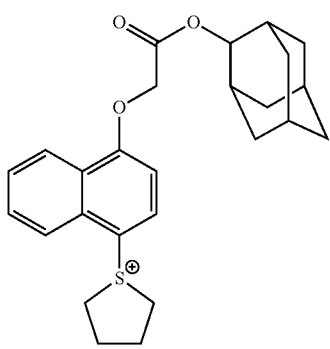
(ca-1-24)
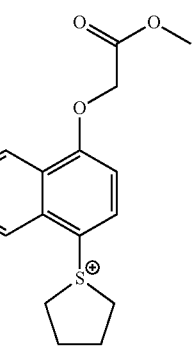
[In the formula, $R''^{201}$ is a hydrogen atom or a substituent, and the substituent is the same as those exemplified as the substituent which $R^{201}$ to $R^{207}$, $R^{210}$, and $R^{212}$ may have.
In addition, as the cation represented by formula (ca-1), cations represented by any one of general formulae (ca-1-25) to (ca-1-35) are also preferable.
[Chemical formula 20]
(ca-1-25)
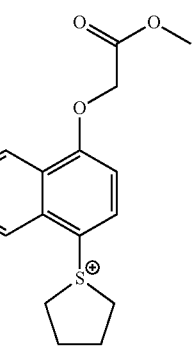
(ca-1-26)
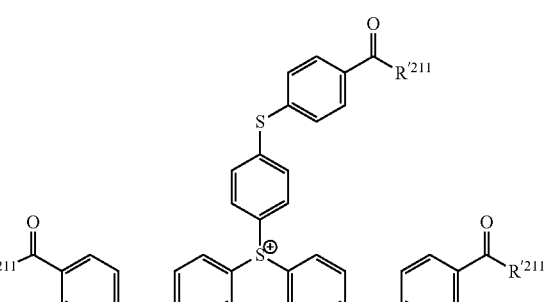
(ca-1-27)
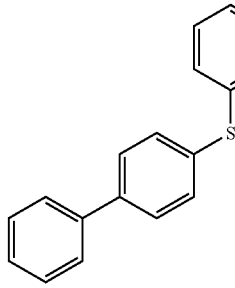

(ca-1-28)
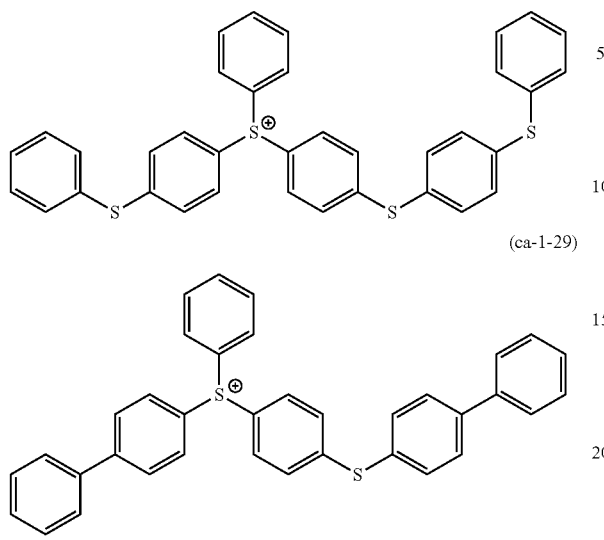
(ca-1-29)
[Chemical formula 21]
(ca-1-30)
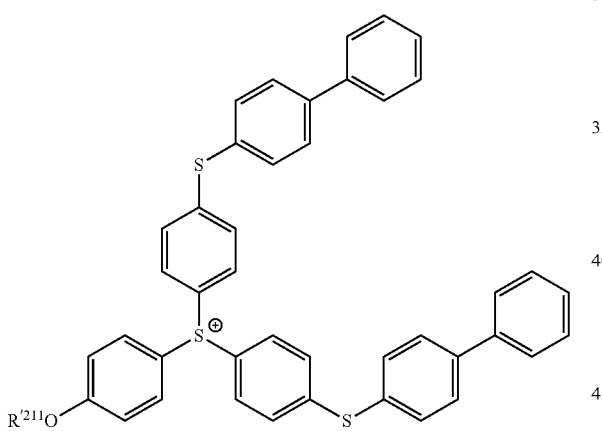
(ca-1-31)
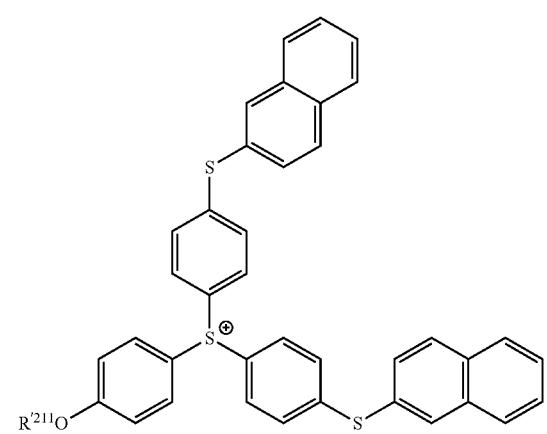
(ca-1-32)
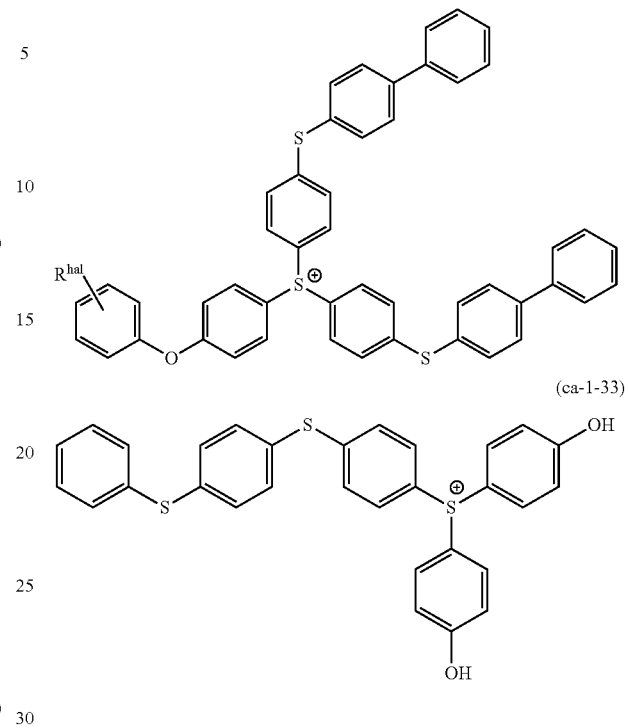
(ca-1-33)
(ca-1-34)
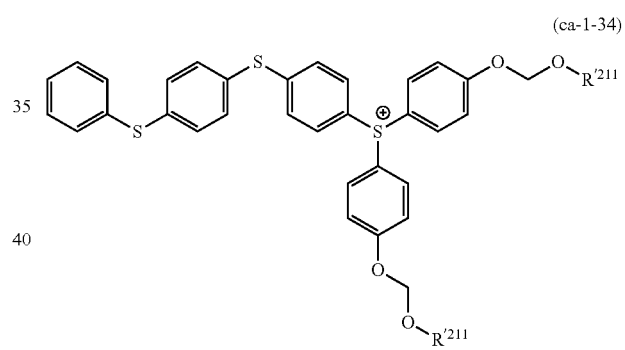
(ca-1-35)
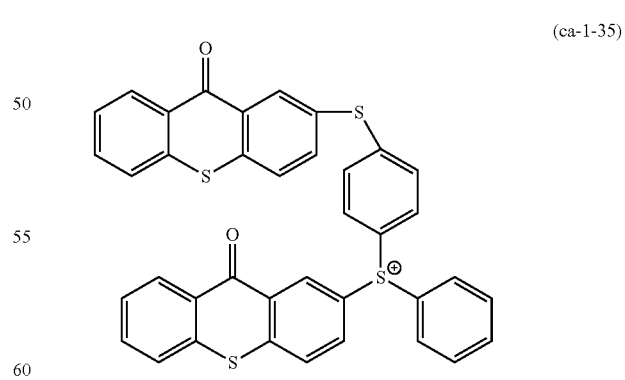
[In formulae, $R'^{211}$ is an alkyl group and $R^{hal}$ is a hydrogen atom or a halogen atom.]
In addition, the cation represented by formula (ca-1) is also preferably a cation represented by any one of Chemical formulae (ca-1-36) to (ca-1-46).

[Chemical formula 22]
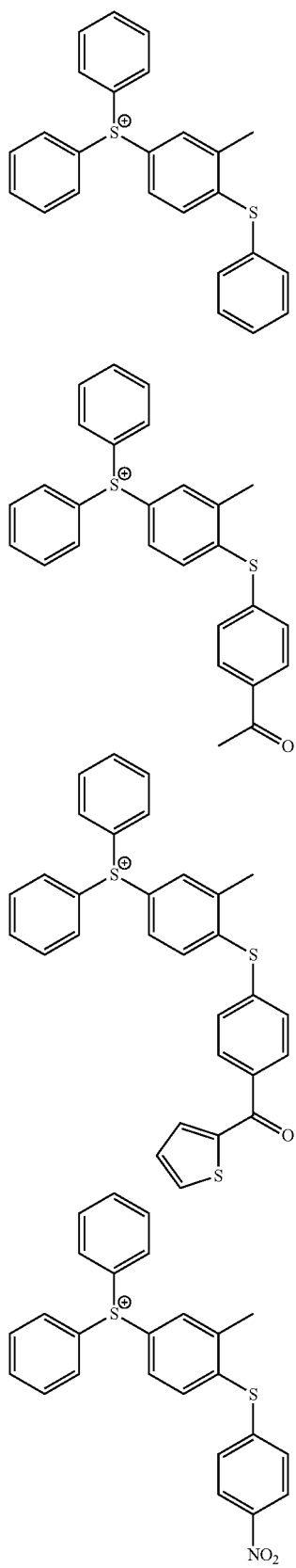
(ca-1-36)
(ca-1-37)
(ca-1-38)
(ca-1-39)
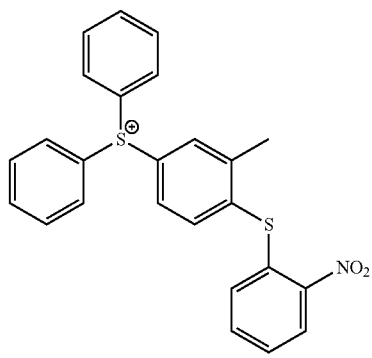
(ca-1-40)
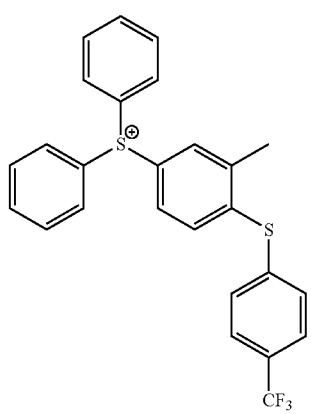
(ca-1-41)
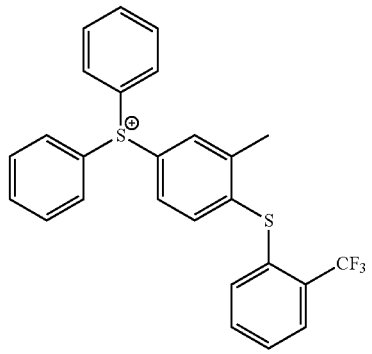
(ca-1-42)
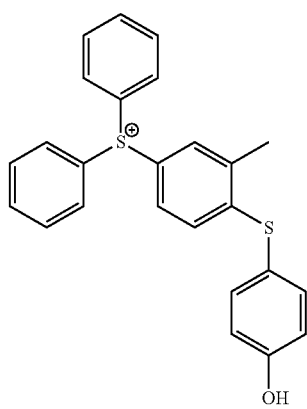
(ca-1-43)

(ca-1-44)
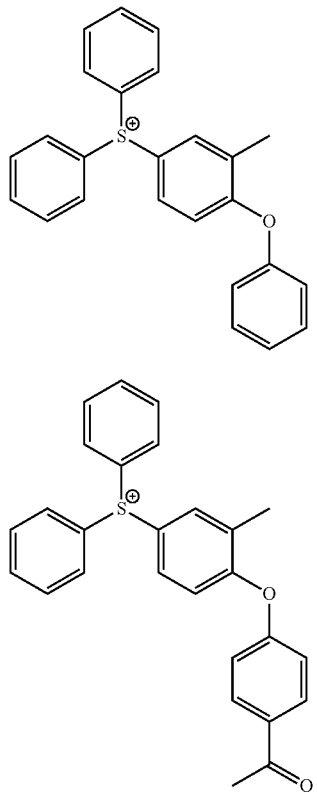
(ca-1-45)
(ca-1-46)
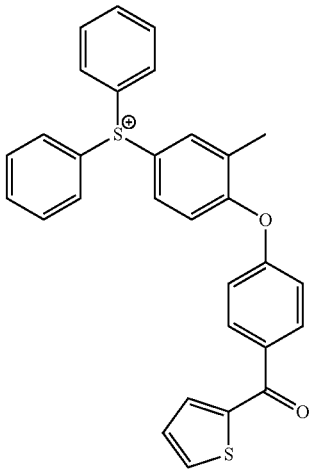
Specific examples of suitable cations represented by formula (ca-2) include diphenyliodonium cations, bis(4-tert-butylphenyl) iodonium cations, and the like.
Specific examples of suitable cations represented by formula (ca-4) include the cations respectively represented by formulae (ca-4-1) to (ca-4-2).
[Chemical formula 23]
(ca-4-1)
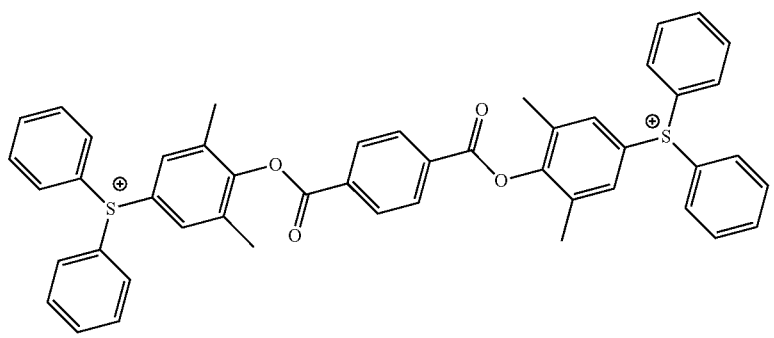
(ca-4-2)
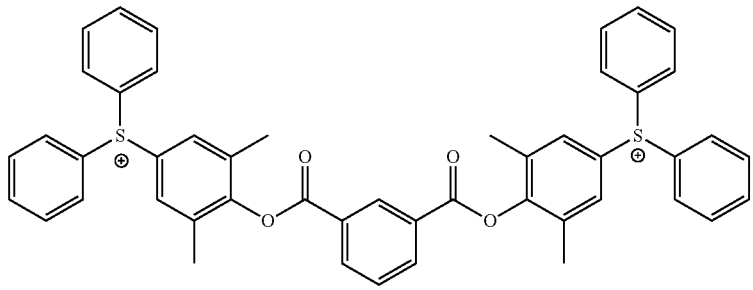

In addition, as the cation represented by formula (ca-5), the cations represented by any one of general formulae (ca-5-1) to (ca-5-3) are also preferable.
[Chemical formula 24]
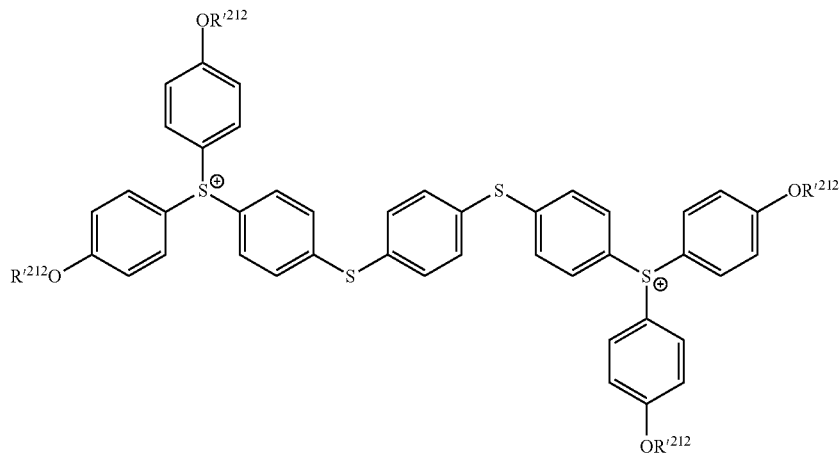
(ca-5-1)
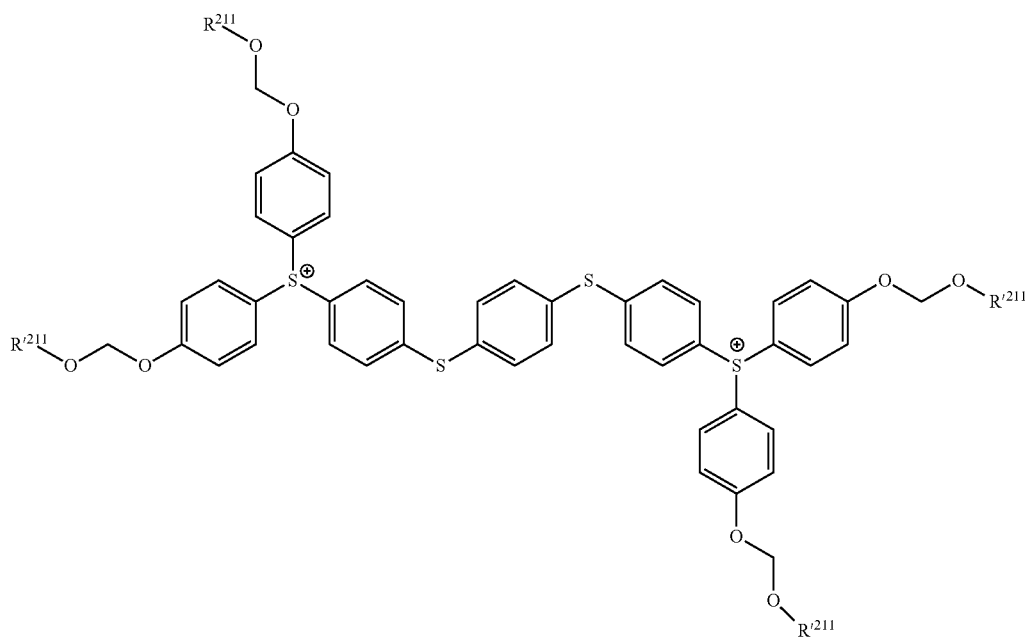
(ca-5-2)
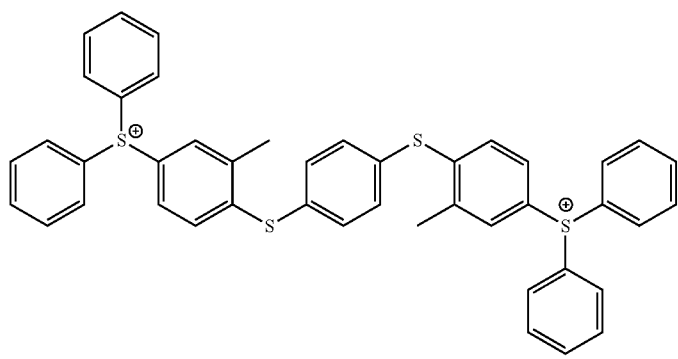
(ca-5-3)

[In the formulae, $R'^{212}$ is an alkyl group or a hydrogen atom. $R'^{211}$ is an alkyl group.]

In the description, the cation moiety $[(Q^{q+})_{1/q}]$ is preferably a cation represented by general formula (ca-1), and more preferably cations respectively represented by formulae (ca-1-1) to (ca-1-46).

In addition, the component (B0) is preferably a cationic polymerization initiator which generates an acid having a pKa (acid dissociation constant) of −5 or less by exposure. More preferably, by using a cationic polymerization initiator which generates an acid having a pKa of −6 or less, even more preferably a pKa of −8 or less, it is possible to obtain high sensitivity to exposure. The lower limit of the pKa of the acid generated by the component (B0) is preferably −15 or more.

In the present invention, "pKa (acid dissociation constant)" is a constant generally used as an index showing the acid strength of a target substance. In this specification, pKa is a value under a temperature condition of 25° C. In addition, it is possible to obtain the pKa value by measurement by a known method. In addition, it is also possible to use values calculated using known software such as "ACD/Labs" (trade name, manufactured by Advanced Chemistry Development).

For the component (B0), one type of the acid generators may be used alone, or two or more types may be used in combination.

The content ratio of the component (B0) in the photosensitive composition of the present invention is preferably 0.01 to 20 parts by mass with respect to 100 parts by mass of the component (A), more preferably 0.1 to 10 parts by mass, even more preferably 0.2 to 5 parts by mass, and particularly preferably 0.5 to 2 parts by mass.

In addition, in the photosensitive composition of the present invention, the content ratio of the component (B0) in the component (B) is not particularly limited, and it is possible to appropriately determine the content ratio according to the structure of the component (B0) and component (B1), the acid derived from the anion moiety, and the like. Specifically, the content ratio of the component (B0) in the component (B) is preferably 20 to 99.999% by mass, more preferably 30 to 99.99% by mass, even more preferably 40 to 99.9% by mass, particularly preferably 60 to 99.9% by mass, and most preferably 90 to 99.6% by mass.

By the content ratio of the component (B0) being within this range, it is possible to set the strength of a plurality of types of acids generated from the polymerization initiator by exposure to be appropriate as a whole, and to obtain a good patterning property.

[Component (B1)]

The component (B1) is a cationic polymerization initiator which generates an acid having a pKa of −3 or more and does not correspond to the component (B0). By using the component (B1) which generates a relatively weak acid having a pKa of −3 or more in combination with the component (B0), the sensitivity is not excessive at the time of pattern formation and it is possible to form a high-resolution pattern.

The component (B1) is not particularly limited as long as the component (B1) is a cationic polymerization initiator which generates an acid having a pKa of −3 or more, preferably pKa of 0 or more, more preferably pKa of 1 or more, but a compound which is an onium salt and does not have a halogen atom in the anion moiety thereof is preferable. Using the component (B1) having no halogen atom in the anion moiety makes it possible to reduce the generation of gas (degasification). The upper limit value of the pKa of the acid generated by the component (B1) is preferably 5 or less.

Among these, as the component (B1), one or more types of compound selected from the group consisting of a compound represented by general formula (b1-1) (referred to below as "component (b1-1)") and a compound represented by general formula (b1-2) (referred to below as "component (b1-2)") are preferable.

[Chemical formula 25]

[In the formulae, $R^{b11}$ and $R^{b12}$ are a cyclic group which may have a substituent other than a halogen atom, a chain alkyl group which may have a substituent other than a halogen atom, or a chain alkenyl group which may have a substituent other than a halogen atom. m is an integer of 1 or more, and $M^{m+}$'s are each independently an m-valent organic cation.]

{Component (B1-1)}
Anion Moiety

In formula (b1-1), $R^{b11}$ is a cyclic group which may have a substituent other than a halogen atom, a chain alkyl group which may have a substituent other than a halogen atom, or a chain alkenyl group which may have a substituent other than a halogen atom, and among the cyclic groups, the chain alkyl groups, and the chain alkenyl groups in the description of $R'^{201}$, examples include those having no substituent or those having a substituent other than a halogen atom.

In the present specification, "may have a substituent other than a halogen atom" not only excludes the case of having a substituent formed only of a halogen atom, but also excludes the case of having a substituent including at least one halogen atom (for example, the case where the substituent is a fluorinated alkyl group).

Among these, as $R^{b11}$, an aromatic hydrocarbon group which may have a substituent other than a halogen atom, an aliphatic cyclic group which may have a substituent other than a halogen atom, or a chain alkyl group which may have a substituent other than a halogen atom are preferable. Examples of the substituent which these groups may have include a hydroxyl group, an oxo group, an alkyl group, an aryl group, a lactone-containing cyclic group, an ether bond, an ester bond, or a combination thereof.

In the case where an ether bond or an ester bond is included as a substituent, this may be via an alkylene group, and the substituent in this case is preferably a linking group represented by formulae (y-a1-1) to (y-a1-5).

[Chemical formula 26]

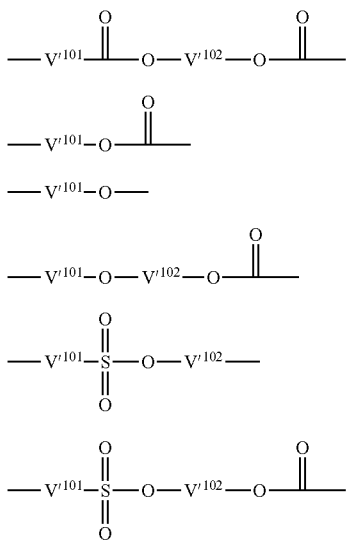

(y-al-2)
(y-al-3)
(y-al-4)
(y-al-5)
(y-al-6)
(y-al-7)

[In the formulae, $V'^{101}$ is a single bond or an alkylene group having 1 to 5 carbon atoms, and $V'^{102}$ is a divalent saturated hydrocarbon group having 1 to 30 carbon atoms.]

The divalent saturated hydrocarbon group in $V'^{102}$ is preferably an alkylene group having 1 to 30 carbon atoms, more preferably an alkylene group having 1 to 10 carbon atoms, and even more preferably an alkylene group having 1 to 5 carbon atoms.

The alkylene group of $V'^{101}$ and $V'^{102}$ may be a linear alkylene group or a branched alkylene group, and is preferably a linear alkylene group.

Specific examples of the alkylene group of $V'^{101}$ and $V'^{102}$ include a methylene group [—CH$_2$—]; an alkyl methylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and C(CH$_2$CH$_3$)$_2$—; an ethylene group [—CH$_2$CH$_2$—]; an alkyl ethylene group such as —CH(CH$_3$)CH$_2$—, —CH(CH$_3$)CH(CH$_3$)—, —C(CH$_3$)$_2$CH$_2$—, and —CH(CH$_2$CH$_3$)CH$_2$—; a trimethylene group (n-propylene group) [—CH$_2$CH$_2$CH$_2$—]; an alkyltrimethylene group such as —CH(CH$_3$)CH$_2$CH$_2$—, and —CH$_2$CH(CH$_3$)CH$_2$—; a tetramethylene group [—CH$_2$CH$_2$CH$_2$CH$_2$—]; an alkyl tetramethylene group such as —CH(CH$_3$)CH$_2$CH$_2$CH$_2$—, and —CH$_2$CH(CH$_3$)CH$_2$CH$_2$—; a pentamethylene group [—CH$_2$CH$_2$CH$_2$CH$_2$CH$_2$—] and the like.

In addition, a part of methylene groups in the alkylene group in $V'^{101}$ or $V'^{102}$ may be substituted with a divalent aliphatic cyclic group having 5 to 10 carbon atoms. The aliphatic cyclic group is preferably a divalent group in which one more hydrogen atom is removed from the cyclic aliphatic hydrocarbon group of $R'^{201}$ (a monocyclic alicyclic hydrocarbon group, a polycyclic alicyclic hydrocarbon group) and more preferably a cyclohexylene group, a 1,5-adamantylene group, or a 2,6-adamantylene group.

The aromatic hydrocarbon group is more preferably a phenyl group or a naphthyl group.

The aliphatic cyclic group is more preferably a group in which one or more hydrogen atoms are removed from a polycycloalkane such as adamantane, norbornane, isobornane, tricyclodecane, tetracyclododecane, or the like.

The chain alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, and a decyl group; a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

$R^{b11}$ is preferably a cyclic group which may have a substituent other than a halogen atom.

Preferable specific examples of the anion moiety of the component (d1-1) are shown below.

[Chemical formula 27]

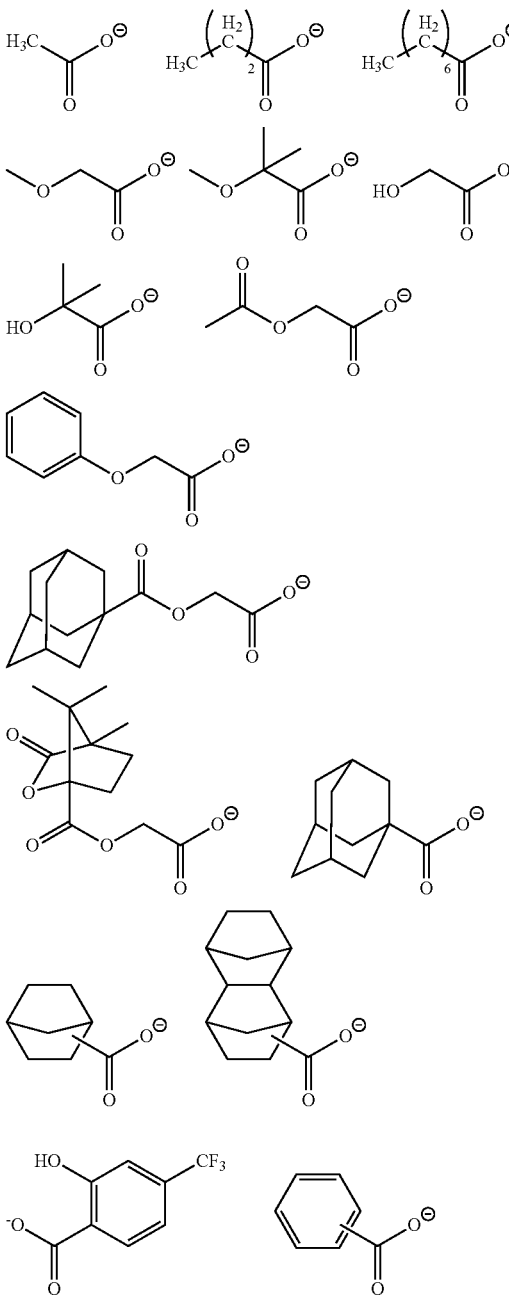

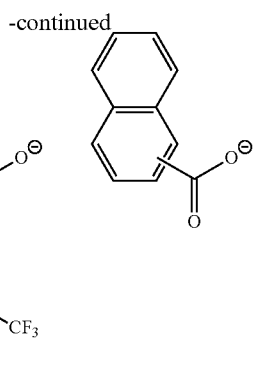

Cation Moiety

In formula (b1-1), $M^{m+}$ is an m-valent organic cation.

Preferable examples of the organic cation of $M^{m+}$ are the same as the cations respectively represented by general formulae (ca-1) to (ca-5), and, among these, the cation represented by general formula (ca-1) is more preferable. Among these, a sulfonium cation in which at least one of $R^{201}$, $R^{202}$, and $R^{203}$ in general formula (ca-1) is an organic group (an aryl group, a heteroaryl group, an alkyl group, or an alkenyl group) having 16 or more carbon atoms which may have a substituent is particularly preferable in order to improve the resolution and roughness characteristics.

The substituent which the organic group may have is the same as the above, and examples thereof include an alkyl group, a halogen atom, a halogenated alkyl group, a carbonyl group, a cyano group, an amino group, an oxo group (=O), an aryl group, and groups represented by formulae (ca-r-1) to (ca-r-10).

The number of carbon atoms in the organic group (aryl group, heteroaryl group, alkyl group, or alkenyl group) is preferably 16 to 25, more preferably 16 to 20, particularly preferably 16 to 18, and preferable examples of the $M^{m+}$ organic cations include those represented by each of formulae (ca-1-25), (ca-1-26), (ca-1-28) to (ca-1-36), (ca-1-38), and (ca-1-46).

As the component (b1-1), one type may be used alone, or two or more types may be used in combination.

{Component (B1-2)}

Anion Moiety

In formula (b1-2), $R^{b12}$ is a cyclic group which may have a substituent other than a halogen atom, a chain alkyl group which has a substituent other than a halogen atom, or a chain alkenyl group which may have a substituent other than a halogen atom, and, in the cyclic group, the chain alkyl group and the chain alkenyl group in the description of $R'^{201}$, examples include those having no substituent or those having a substituent other than a halogen atom.

$R^{b12}$ is preferably a chain alkyl group which may have a substituent other than a halogen atom or an aliphatic cyclic group which may have a substituent other than a halogen atom.

The chain alkyl group preferably has 1 to 10 carbon atoms, and more preferably 3 to 10 carbon atoms. Examples of the aliphatic cyclic group include a group (which may have a substituent other than a halogen atom) in which one or more hydrogen atoms are removed from adamantane, norbornane, isobornane, tricyclodecane, tetracyclododecane, or the like; and more preferably a group in which one or more hydrogen atoms are removed from camphor or the like.

The hydrocarbon group of $R^{b12}$ may have a substituent other than a halogen atom, and examples of the substituents are the same as the substituents other than halogen atoms which the hydrocarbon group (aromatic hydrocarbon group, aliphatic cyclic group, chain alkyl group) in $R^{b11}$ of formula (b1-1) may have.

Preferable examples of the anion moiety of the component (b1-2) are shown below.

[Chemical formula 28]

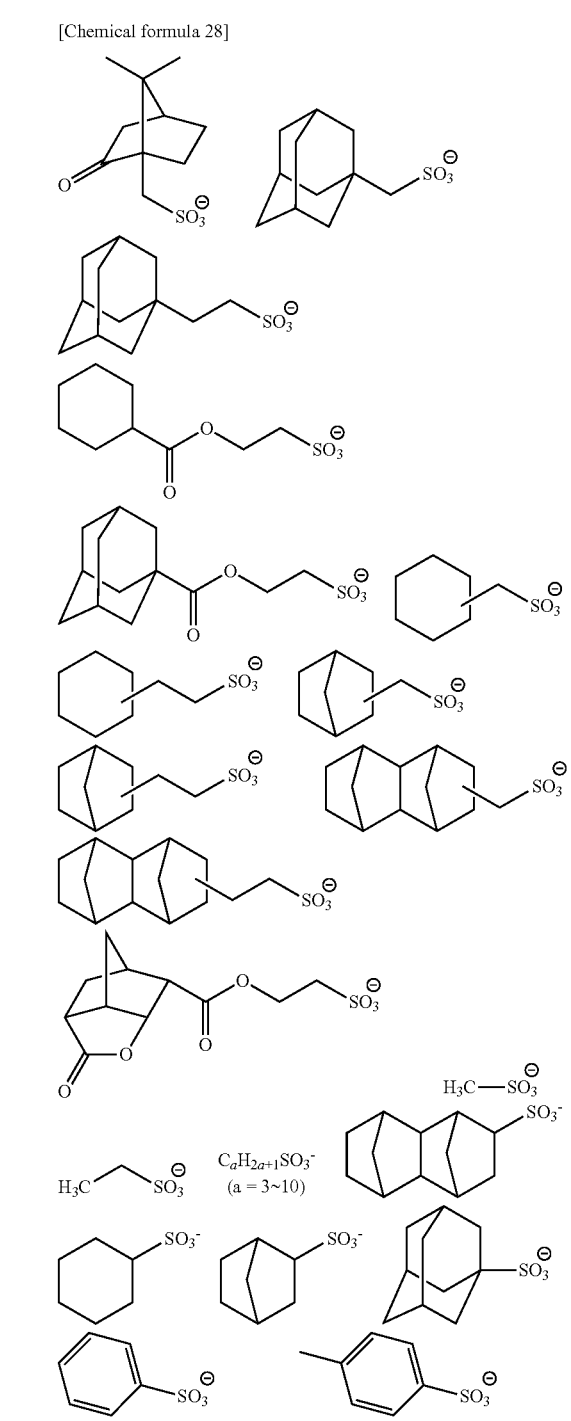

Cation Moiety

In formula (b1-2), $M^{m+}$ is an m-valent organic cation, which is the same as $M^{m+}$ in formula (b1-1). Among these, preferable examples of the organic cation of $M^{m+}$ include those cations represented by formulae (ca-1-25), (ca-1-26), (ca-1-28) to (ca-1-36), (ca-1-38), and (ca-1-46), respectively.

As component (b1-2), one type may be used alone, or two or more types may be used in combination.

As component (B1), only one of the components (b1-1) to (b1-2) may be used, or two or more types may be used in combination.

Among these, it is preferable to use at least the component (b1-2) as the component (B1).

The content ratio of the component (B1) in the photosensitive composition of the present invention is preferably 0.001 to 5 parts by mass with respect to 100 parts by mass of the component (A), more preferably 0.005 to 1 part by mass, and particularly preferably 0.01 to 0.1 parts by mass.

In addition, in the photosensitive composition of the present invention, the content ratio of the component (B1) in the component (B) is not particularly limited, and it is possible to appropriately determine the content ratio according to the structure of the component (B0) and the component (B1), and the acid derived from the anion moiety, or the like. Specifically, the content ratio of the component (B1) in the component (B) is preferably 0.001 to 80% by mass, more preferably 0.01 to 70% by mass, even more preferably 0.1 to 60% by mass, particularly preferably 0.4 to 40% by mass, and most preferably 1 to 10% by mass. Within this range, it is possible to set the strength of a plurality of types of acids generated from the polymerization initiator by exposure to be appropriate as a whole, and it is possible to obtain a good patterning property.

Method for Producing Component (B1):

The method for producing the components (b1-1) and (b1-2) is not particularly limited, and production by a known method is possible.

In the photosensitive composition of the present invention, the ratio of the component (B0) to the component (B1) is preferably 5 to 200, more preferably 10 to 100, and even more preferably 15 to 50 as the mass ratio represented by component (B0)/component (B1) (also referred to below as "B0/B1").

By setting B0/B1 within this range, it is possible to easily adjust to an appropriate sensitivity and to form a higher resolution pattern. In addition, when B0/B1 is a preferable lower limit value or more in this range, in particular, the effects of suppressing pattern collapse and reducing roughness are more easily obtained, and when B0/B1 is the preferable upper limit value or less in this range, it is easy to improve the sensitivity.

The content of the component (B) in the photosensitive composition of the present invention is preferably 0.01 to 60 parts by mass with respect to 100 parts by mass of the component (A), more preferably 0.05 to 30 parts by mass, even more preferably 0.05 to 20 parts by mass, and particularly preferably 0.1 to 10 parts by mass.

By setting the content of the component (B) within this range, it is possible to obtain sufficient sensitivity and to reduce the generation of anti-corrosive gas.

<Optional Component>

[Sensitizer (C)]

In addition to the components (A) and (B), the photosensitive composition of the present invention may further contain a sensitizer (also referred to below as "component (C)").

The sensitizer of the component (C) is not particularly limited as long as it is possible to absorb energy by exposure and transmit the energy to other substances.

Specific examples of the component (C) include benzobenzophenone-based photosensitizers such as benzophenone and p,p'-tetramethyldiaminobenzophenone, carbazole-based photosensitizers, acetophen-based photosensitizers, naphthalene-based photosensitizers such as 1,5-dihydroxy naphthalene, phenol-based photosensitizers, anthracene-based photosensitizers such as 9-ethoxyanthracene, and known photosensitizers such as biacetyl, eosin, rose bengal, pyrene, phenothiazine, and anthrone.

Among these, as the component (C), a sensitizer having a polar group or a sensitizer having a number of carbon atoms of 6 to 18 is preferable, and 1,5-dihydroxynaphthalene is particularly preferable.

As the component (C), one type may be used alone, or two or more types may be used in combination.

The content of the component (C) is preferably 0.1 to 15 parts by mass with respect to 100 parts by mass of the component (A), more preferably 0.3 to 10 parts by mass, even more preferably 0.5 to 5 parts by mass. Within these ranges, it is possible to obtain good sensitivity and resolution.

[Component (S): Organic Solvent Component]

It is possible to produce the photosensitive composition by dissolving the photosensitive material in an organic solvent component (may be referred to below as "component (S)").

As the component (S), any component may be used as long as it is able to dissolve the respective components to be used and form a homogeneous solution, and it is possible to use arbitrary components appropriately selected from known solvents for photosensitive compositions in the related art.

For example, lactones such as γ-butyrolactone; ketones such as acetone, methyl ethyl ketone, cyclohexanone, methyl-n-pentyl ketone, methyl isopentyl ketone, and 2-heptanone; polyvalent alcohols such as ethylene glycol, diethylene glycol, propylene glycol, and dipropylene glycol; compounds having an ester bond such as ethylene glycol monoacetate, diethylene glycol monoacetate, propylene glycol monoacetate, and dipropylene glycol monoacetate, monoalkyl ethers such as monomethyl ether, monoethyl ether, monopropyl ether, or monobutyl ether of compounds having a polyvalent alcohol or an ester bond, or derivatives of polyvalent alcohols such as compounds having an ether bond such as monophenyl ether, [among these, propylene glycol monomethyl ether acetate (PGMEA) and propylene glycol monomethyl ether (PGME) are preferable]; cyclic ethers such as dioxane and esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, and mesitylene, dimethyl sulfoxide (DMSO) and the like.

Component (S) may be used alone or may be used as a mixed solvent of two or more types.

Among these, methyl ethyl ketone, PGMEA, PGME, γ-butyrolactone, EL, and cyclohexanone are preferable.

In addition, a mixed solvent in which PGMEA and a polar solvent are mixed is also preferable. The blending ratio (mass ratio) may be appropriately determined in consideration of compatibility between PGMEA and a polar solvent, but is preferably within 1:9 to 9:1, and more preferably 2:8 to 8:2.

More specifically, in the case where EL or cyclohexanone is blended as a polar solvent, the mass ratio of PGMEA:EL or cyclohexanone is preferably 1:9 to 9:1, and more preferably 2:8 to 8:2. In addition, in the case where PGME is added as a polar solvent, the mass ratio of PGMEA:PGME is preferably 1:9 to 9:1, more preferably 2:8 to 8:2, and even more preferably 3:7 to 7:3. Furthermore, a mixed solvent of PGMEA and PGME and cyclohexanone is also preferable.

In addition, as another component (S), a mixed solvent of at least one selected from PGMEA and EL and γ-butyrolactone is also preferable. In such a case, as the mixing ratio, the mass ratio of the former and the latter is preferably 70:30 to 95:5.

The usage amount of the component (S) is not particularly limited, and is appropriately set according to the coated film thickness at a concentration able to be coated onto a substrate or the like. Generally, the component (S) is used so that the solid content concentration of the photosensitive composition is in the range of 1% to 20% by mass, and preferably 2% to 15% by mass.

[Other Additives]

It is possible to add, as desired, miscible additives, for example, an additional resin for improving the performance of the film, a dissolution inhibitor, a basic compound, a plasticizer, a stabilizer, a colorant, a halation inhibitor, a dye, or the like as appropriate to the photosensitive composition of the present invention to be further contained therein.

In addition, the photosensitive composition of the present invention may further contain an adhesion aid in order to improve the adhesion to the support. As this adhesion aid, a functional silane coupling agent is preferable. Examples of the functional silane coupling agent include a silane coupling agent having a reactive substituent such as a carboxyl group, a methacryloyl group, an isocyanate group, an epoxy group or the like, and specific examples thereof include trimethoxysilylbenzoic acid, γ-methacryloxypropyltrimethoxysilane, vinyltriacetoxysilane, vinyltrimethoxysilane, γ-glycidoxypropyltrimethoxysilane, β-(3,4-epoxycyclohexyl) ethyltrimethoxysilane, and the like.

According to the photosensitive composition of the present invention, it is possible to achieve high sensitivity and to form a high-resolution pattern.

As a cationic polymerization initiator, the photosensitive composition of the present invention has a component (B0) having a specific structure which generates a strong acid by exposure and a component (B1) which generates a weak acid having a pKa of −3 or more by exposure. First, it is possible to obtain high sensitivity to exposure due to the strong acid derived from the component (B0). In addition, in the related art, in the case where a polymerization initiator which generates a strong acid is used, the added amount of the polymerization initiator is decreased, and as a result, although the sensitivity is high, there is a problem in that the cross-linking rate (curing rate) of the base material component is lowered. In contrast, in the present invention, by using the component (B1) which generates a weak acid in combination, it is possible to increase the amount of acid generated by the weak acid derived from the component (B1) and to improve the cross-linking rate (curing rate) of the base material component, and it is possible to form a pattern with high resolution. In addition, it is possible to form a pattern shape, in particular, a good pattern in which the roughness of the pattern side wall is reduced.

<<Pattern Formation Method>>

The pattern formation method according to the second aspect of the present invention has a step of forming a film on a support using the negative photosensitive composition according to the first aspect of the present invention, a step of selectively exposing the film, and a step of developing the film after the exposure to form a negative pattern.

It is possible to carry out the pattern formation method of the present invention, for example, as follows.

Film Forming Step

First, the photosensitive composition of the first aspect of the present invention is coated on a support by a known method such as a spin coating method, a roll coating method, a screen printing method, or the like, and a baking (post applied bake (PAB)) treatment is performed at a temperature condition of, for example, 55° C. to 150° C. for 2 to 60 minutes to form a film.

In addition, it is also possible to use the photosensitive composition of the first aspect of the present invention as a photosensitive dry film, specifically, after using the negative photosensitive composition of the present invention to make a photosensitive dry film in advance by a known method, the film may be formed on the support by attaching the photosensitive dry film to the support. At the time of application, heating, pressing (lamination) and the like of the support and the photosensitive dry film may be carried out as necessary.

The support is not particularly limited and it is possible to use conventionally known supports and examples thereof include substrates for electronic components and supports where a prescribed wiring pattern is formed on such a substrate. More specifically, a substrate formed of a metal such as a silicon wafer, copper, chromium, iron or aluminum, a glass substrate, a film such as polyethylene terephthalate, polyethylene naphthalate, polypropylene, polyethylene or the like. As the material of the wiring pattern, it is possible to use for example, copper, aluminum, nickel, gold, or the like.

In addition, as the support, an inorganic and/or organic film may be provided on the substrate as described. Examples of inorganic films include an inorganic antireflection film (inorganic BARC). Examples of organic films include an organic antireflection film (organic BARC) and an organic film such as the lower layer organic film in a multilayer resist method.

Here, the multilayer resist method is a method in which at least one organic film (lower layer organic film) and at least one resist film (upper layer resist film) are provided on a substrate and patterning of the lower layer organic film is performed with a resist pattern formed on the upper layer resist film as a mask and in which it is possible to form a pattern with a high aspect ratio. That is, according to the multilayer resist method, since it is possible to secure the required thickness with the lower layer organic film, it is possible to thin the resist film and to form fine patterns with a high aspect ratio.

Basically, multilayer resist methods are divided into methods of forming a two-layer structure of an upper layer resist film and a lower layer organic film (two-layer resist method) and methods of forming a multilayer structure of three or more layers in which one or more intermediate layers (metal thin films or the like) are provided between the upper layer resist film and the lower layer organic film (three-layer resist method).

The film thickness of the film formed from the photosensitive composition is not particularly limited, but is preferably approximately 10 to 100 μm. The photosensitive composition of the present invention is able to obtain good characteristics even in the case where a thick film is formed.

Exposure Step

Next, using a known exposure apparatus, the formed film is subjected to exposure through a mask (mask pattern) on which a predetermined pattern is formed or to selective exposure by drawing or the like by direct irradiation with electron beams without passing through a mask pattern, then a post exposure bake (PEB) treatment is performed for 40 to 600 seconds and preferably 60 to 300 seconds at a temperature condition of, for example, 80° C. to 150° C., as necessary.

The wavelength used for exposure is not particularly limited, and the film is selectively irradiated (exposed) with radiation, for example, ultraviolet rays or visible rays having a wavelength of 300 to 500 nm. As the radiation source of this radiation, it is possible to use a low-pressure mercury vapor lamp, a high-pressure mercury vapor lamp, an ultra-high-pressure mercury vapor lamp, a metal halide lamp, an argon gas laser, or the like. Here, the radiation means ultraviolet rays, visible rays, far ultraviolet rays, X-rays, electron beams, or the like. The irradiation dose varies depending on the type of each component in the composition, the blending amount, the film thickness of the coating film, and the like, but in the case of using an ultrahigh-pressure mercury vapor lamp, for example, the radiation dose is 100 to 2,000 mJ/cm$^2$. Then, as necessary, in the case of using a chemically amplified resist composition, after exposure, heating is carried out by a known method to accelerate the generation and diffusion of an acid, and the alkali solubility of the resist film at the exposed areas is changed.

The exposure method of the resist film may be ordinary exposure (dry exposure) performed in an inert gas such as air or nitrogen, or immersion exposure (Liquid Immersion Lithography).

Development Step

Next, the film is subjected to a development treatment. After the development treatment, a rinse treatment is preferably performed. A baking process (post-bake) may be performed as necessary.

The developing solution used for the developing treatment may be an alkaline aqueous solution or an organic developing solution containing an organic solvent.

Examples of the alkali developing solution include a 0.1 to 10% by mass tetramethylammonium hydroxide (TMAH) aqueous solution.

The organic solvent contained in the organic developing solution may be any organic solvent as long as it is possible to dissolve the component (A) (component (A) before exposure) and it is possible to appropriately select the organic solvent from known organic solvents. Specific examples thereof include polar solvents such as ketone solvents, ester solvents, alcohol solvents, nitrile solvents, amide solvents and ether solvents, hydrocarbon solvents, and the like.

Examples of the ketone solvents include 1-octanone, 2-octanone, 1-nonanone, 2-nonanone, acetone, 4-heptanone, 1-hexanone, 2-hexanone, diisobutylketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, γ-butyrolactone, methyl amyl ketone (2-heptanone), and the like. Among these, methyl amyl ketone (2-heptanone) is preferable as the ketone solvent.

Examples of the ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate (PGMEA), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, propyl-3-methoxypropionate, and the like. Among these, butyl acetate or PGMEA is preferable as the ester solvent.

Examples of the nitrile solvents include acetonitrile, propionitrile, valeronitrile, butyronitrile, and the like.

It is possible to add a known additive to the organic developing solution, as necessary. Examples of such additives include surfactants. The surfactant is not particularly limited, but it is possible to use, for example, ionic or nonionic fluorine-based and/or silicon-based surfactants and the like.

The surfactant is preferably a nonionic surfactant, and more preferably a nonionic fluorine-based surfactant or a nonionic silicon-based surfactant.

In the case of blending a surfactant, the blending amount thereof is usually 0.001 to 5% by mass, preferably 0.005 to 2% by mass, and more preferably 0.01 to 0.5% by mass, with respect to the total amount of the organic developing solution.

It is possible to carry out the developing treatment by a known developing method, for example, a method in which the support is dipped in a developing solution for a certain time (dip method), a method in which the developing solution is raised on the surface of the support by surface tension and held for a certain time (puddle method), a method of spraying a developing solution on the surface of the support (spray method), a method in which a developing solution is continuously dispensed on a support rotating at a constant speed while scanning the developing solution-coating nozzle at a constant speed (dynamic dispense method), and the like.

It is possible to carry out the rinse treatment (washing treatment) using the rinsing liquid by a known rinsing method. Examples of methods of the rinsing treatment include a method of continuously dispensing the rinsing liquid onto a support rotating at a constant speed (rotary coating method), a method of immersing the support in the rinsing liquid for a certain time (dip method), and a method of spraying a rinsing liquid onto the surface of the support (spray method), and the like.

In the case of an alkaline developing solution, the rinse treatment is preferably a water rinse using pure water, and in the case of an organic developing solution, it is preferable to use a rinse liquid containing an organic solvent.

According to the pattern formation method of the aspect, since the photosensitive composition which is the first aspect is used, it is possible to achieve high sensitivity and form a pattern with high resolution and reduced roughness.

EXAMPLES

The present invention will be described in more detail below with reference to examples, but the present invention is not limited by these examples.

In the present examples, the compound represented by Chemical formula (1) is described as "compound (1)", and the compounds represented by other chemical formulas are also described in the same manner.

Examples 1 to 36, Comparative Examples 1 to 3, and Reference Examples 1 and 2

<Preparation of Photosensitive Composition>

According to Tables 1 to 3, the component (A) was dissolved in an organic solvent as component (S), and the component (B0), the component (B1), the component (B2) (only in Comparative Example 2), the component (C), and the additive were added thereto and stirred until complete dissolution was performed, and filtration was performed using a PTFE filter (pore diameter 1 μm, Pall Corp.), thereby preparing each of the negative photosensitive compositions to be used in the pattern formation methods of the respective examples.

TABLE 1

|  | Component (A) | | Component (B0) | Component (B1) | Component (B2) | Component (C) | Additive | Component (S) |
|---|---|---|---|---|---|---|---|---|
| Example 1 | (A)-1 [100] | | (B)-01 [1.5] | (B)-11 [0.1] | | (C)-1 [1] | (E)-1 [5] | (S)-1 [20] |
| Example 2 | (A)-1 [100] | | (B)-01 [0.6] | (B)-11 [0.02] | | (C)-1 [1] | (E)-1 [5] | (S)-1 [20] |
| Example 3 | (A)-1 [100] | | (B)-01 [0.5] | (B)-11 [0.01] | | (C)-1 [1] | (E)-1 [5] | (S)-1 [20] |
| Example 4 | (A)-1 [100] | | (B)-01 [0.6] | (B)-12 [0.02] | | (C)-1 [1] | (E)-1 [5] | (S)-1 [20] |
| Example 5 | (A)-1 [75] | (A)-2 [25] | (B)-01 [0.6] | (B)-11 [0.02] | | (C)-1 [1] | (E)-1 [5] | (S)-1 [20] |
| Example 6 | (A)-1 [50] | (A)-2 [50] | (B)-01 [0.6] | (B)-11 [0.02] | | (C)-1 [1] | (E)-1 [5] | (S)-1 [20] |
| Example 7 | (A)-1 [75] | (A)-3 [25] | (B)-01 [0.6] | (B)-11 [0.02] | | (C)-1 [1] | (E)-1 [5] | (S)-1 [20] |
| Example 8 | (A)-1 [100] | | (B)-02 [4.0] | (B)-11 [0.02] | | (C)-1 [1] | (E)-1 [5] | (S)-1 [20] |
| Example 9 | (A)-1 [100] | | (B)-01 [0.6] | (B)-11 [0.02] | | (C)-1 [1] | (E)-1 [5] | (S)-2 [40] |
| Example 10 | (A)-1 [50] | (A)-2 [50] | (B)-01 [0.6] | (B)-11 [0.02] | | (C)-1 [1] | (E)-1 [5] | (S)-2 [40] |
| Example 11 | (A)-1 [100] | | (B)-03 [1.0] | (B)-11 [0.1] | | (C)-1 [1] | (E)-1 [5] | (S)-1 [20] |
| Example 12 | (A)-1 [100] | | (B)-03 [0.4] | (B)-11 [0.02] | | (C)-1 [1] | (E)-1 [5] | (S)-1 [20] |
| Comparative Example 1 | (A)-1 [100] | | (B)-01 [1.5] | | | (C)-1 [1] | (E)-1 [5] | (S)-1 [20] |
| Comparative Example 2 | (A)-1 [100] | | | | (B)-A [1.5] | (C)-1 [1] | (E)-1 [5] | (S)-1 [20] |
| Comparative Example 3 | (A)-1 [100] | | (B)-02 [3.0] | | | (C)-1 [1] | (E)-1 [5] | (S)-1 [20] |

TABLE 2

|  | Component (A) | Component (B0) | Component (B1) | Component (C) | Additive | Component (S) |
|---|---|---|---|---|---|---|
| Example 13 | (A)-1 [100] | (B)-04 [2.5] | (B)-11 [0.1] | (C)-1 [1] | (E)-1 [5] | (S)-1 [20] |
| Example 14 | (A)-1 [100] | (B)-04 [1.0] | (B)-11 [0.02] | (C)-1 [1] | (E)-1 [5] | (S)-1 [20] |
| Example 15 | (A)-1 [100] | (B)-05 [2.5] | (B)-11 [0.1] | (C)-1 [1] | (E)-1 [5] | (S)-1 [20] |
| Example 16 | (A)-1 [100] | (B)-05 [1.0] | (B)-11 [0.02] | (C)-1 [1] | (E)-1 [5] | (S)-1 [20] |
| Example 17 | (A)-1 [100] | (B)-06 [3.5] | (B)-11 [0.1] | (C)-1 [1] | (E)-1 [5] | (S)-1 [20] |
| Example 18 | (A)-1 [100] | (B)-06 [1.5] | (B)-11 [0.02] | (C)-1 [1] | (E)-1 [5] | (S)-1 [20] |
| Example 19 | (A)-1 [100] | (B)-07 [1.0] | (B)-11 [0.1] | (C)-1 [1] | (E)-1 [5] | (S)-1 [20] |
| Example 20 | (A)-1 [100] | (B)-07 [0.4] | (B)-11 [0.02] | (C)-1 [1] | (E)-1 [5] | (S)-1 [20] |
| Example 21 | (A)-1 [100] | (B)-08 [3.0] | (B)-11 [0.1] | (C)-1 [1] | (E)-1 [5] | (S)-1 [20] |

TABLE 2-continued

|  | Component (A) | Component (B0) | Component (B1) | Component (C) | Additive | Component (S) |
|---|---|---|---|---|---|---|
| Example 22 | (A)-1 [100] | (B)-08 [1.0] | (B)-11 [0.02] | (C)-1 [1] | (E)-1 [5] | (S)-1 [20] |
| Example 23 | (A)-1 [100] | (B)-09 [3.0] | (B)-11 [0.1] | (C)-1 [1] | (E)-1 [5] | (S)-1 [20] |
| Example 24 | (A)-1 [100] | (B)-09 [1.0] | (B)-11 [0.02] | (C)-1 [1] | (E)-1 [5] | (S)-1 [20] |

TABLE 3

|  | Component (A) | Component (B0) | Component (B1) | Component (C) | Additive | Component (S) |
|---|---|---|---|---|---|---|
| Example 25 | (A)-1 [100] | (B)-010 [3.0] | (B)-11 [0.1] | (C)-1 [1] | (E)-1 [5] | (S)-1 [20] |
| Example 26 | (A)-1 [100] | (B)-010 [1.0] | (B)-11 [0.02] | (C)-1 [1] | (E)-1 [5] | (S)-1 [20] |
| Example 27 | (A)-1 [100] | (B)-011 [3.0] | (B)-11 [0.1] | (C)-1 [1] | (E)-1 [5] | (S)-1 [20] |
| Example 28 | (A)-1 [100] | (B)-011 [1.0] | (B)-11 [0.02] | (C)-1 [1] | (E)-1 [5] | (S)-1 [20] |
| Example 29 | (A)-1 [100] | (B)-012 [3.0] | (B)-11 [0.1] | (C)-1 [1] | (E)-1 [5] | (S)-1 [20] |
| Example 30 | (A)-1 [100] | (B)-012 [1.0] | (B)-11 [0.02] | (C)-1 [1] | (E)-1 [5] | (S)-1 [20] |
| Example 31 | (A)-1 [100] | (B)-013 [3.0] | (B)-11 [0.1] | (C)-1 [1] | (E)-1 [5] | (S)-1 [20] |
| Example 32 | (A)-1 [100] | (B)-013 [1.0] | (B)-11 [0.02] | (C)-1 [1] | (E)-1 [5] | (S)-1 [20] |
| Example 33 | (A)-1 [100] | (B)-014 [3.0] | (B)-11 [0.1] | (C)-1 [1] | (E)-1 [5] | (S)-1 [20] |
| Example 34 | (A)-1 [100] | (B)-014 [1.0] | (B)-11 [0.02] | (C)-1 [1] | (E)-1 [5] | (S)-1 [20] |
| Example 35 | (A)-1 [100] | (B)-015 [3.0] | (B)-11 [0.1] | (C)-1 [1] | (E)-1 [5] | (S)-1 [20] |
| Example 36 | (A)-1 [100] | (B)-015 [1.0] | (B)-11 [0.02] | (C)-1 [1] | (E)-1 [5] | (S)-1 [20] |
| Reference Example 1 | (A)-1 [100] | (B)-01 [1.5] | (B)-B [0.1] | (C)-1 [1] | (E)-1 [5] | (S)-1 [20] |
| Reference Example 2 | (A)-1 [100] | (B)-01 [1.5] | (B)-C [0.1] | (C)-1 [1] | (E)-1 [5] | (S)-1 [20] |

In Tables 1 to 3, each abbreviation has the following meaning. Each numerical value in the brackets is the blending amount (parts by mass).

(A)-1: a multi-functional bisphenol A type epoxy resin (trade name: JER-157S70, manufactured by Mitsubishi Chemical Corporation) corresponding to formula (anv0) ($R^{EP}$ is a glycidyl group).

(A)-2: a bifunctional bisphenol A type epoxy resin (trade name: EPICLON 1055, manufactured by DIC Corporation) corresponding to formula (abp1) ($R^{EP}$ is a glycidyl group).

(A)-3: a Novolac type epoxy resin (trade name: EPICLON HP 5000, manufactured by DIC Corporation) corresponding to a copolymer of formulae (anv1) and (anv3) ($R^{EP}$ is a glycidyl group, $R^{a27}$ is a methyl group, $R^{a22}$ and $R^{a28}$ to $R^{a30}$ are hydrogen atoms, and $R^{a23}$ is a methyl group).

(B)-01: an acid generator including a compound represented by formula (B)-01 (pKa of generated acid=−6.1).

(B)-02: an acid generator including a compound represented by formula (B)-02 (pKa of generated acid=−9.3).

(B)-03: an acid generator including a compound represented by formula (B)-03 (pKa of generated acid=−6.1).

(B)-04: an acid generator including a compound represented by formula (B)-04 (pKa of generated acid=−6.1).

(B)-05: an acid generator including a compound represented by formula (B)-05 (pKa of generated acid=−6.1).

(B)-06: an acid generator including a compound represented by formula (B)-06 (pKa of generated acid=−6.1).

(B)-07: an acid generator including a compound represented by formula (B)-07 (pKa of generated acid=−6.1).

(B)-08: an acid generator including a compound represented by formula (B)-08 (pKa of generated acid=−6.1).

(B)-09: an acid generator including a compound represented by formula (B)-09 (pKa of generated acid=−6.1).

(B)-010: an acid generator including a compound represented by formula (B)-010 (pKa of generated acid=−6.1).

(B)-011: an acid generator including a compound represented by formula (B)-011 (pKa of generated acid=−6.1).

(B)-012: an acid generator including a compound represented by formula (B)-012 (pKa of generated acid=−6.1).

(B)-013: an acid generator including a compound represented by formula (B)-013 (pKa of generated acid=−6.1).

(B)-014: an acid generator including a compound represented by formula (B)-014 (pKa of generated acid=−6.1).

(B)-015: an acid generator including a compound represented by formula (B)-015 (pKa of generated acid=−6.1).

(B)-11: an acid generator including a compound represented by formula (B)-11 (pKa of generated acid=−1.17).

(B)-12: an acid generator including a compound represented by formula (B)-12 (pKa of generated acid=−2.8).

(B)-A: an acid generator including a compound represented by formula (B)-A (pKa of generated acid=−25).

(B)-B: an acid generator including a compound represented by formula (B)-B (pKa of generated acid=−2.8).

(B)-C: an acid generator including a compound represented by formula (B)-C (pKa of the generated acid=1.17).

(C)-1: 1,5-dihydroxynaphthalene.

(E)-1: Epoxy-based silane coupling agent (trade name: OFS-6040SILANE, manufactured by Dow Corning Toray Silicone Co., Ltd.).

(S)-1: Methyl ethyl ketone.

(S)-2: Propylene glycol monomethyl ether acetate.

[Chemical formula 29]

(B)-01

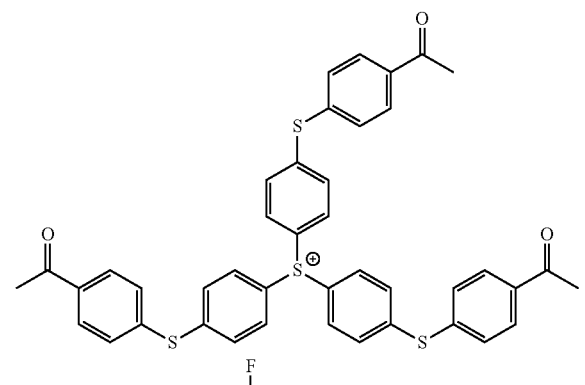

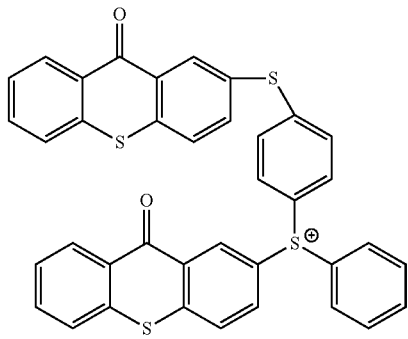

(B)-02

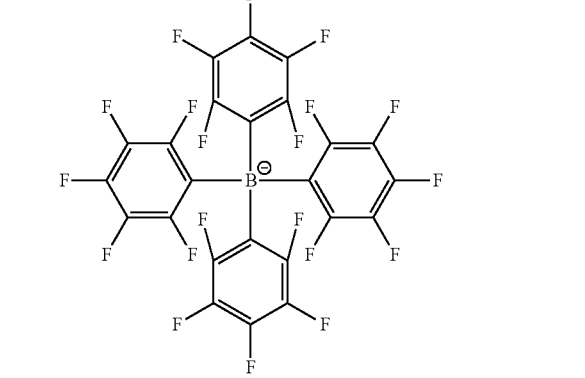

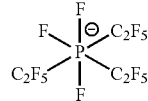

-continued (B)-03

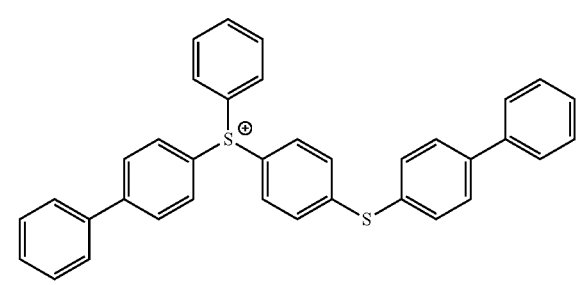

(B)-04

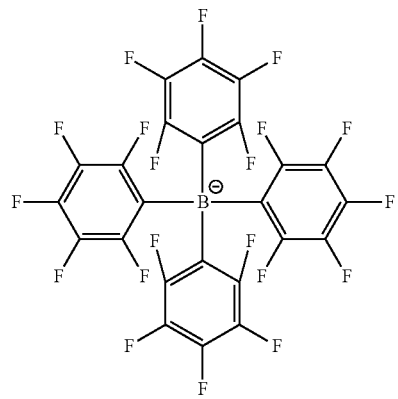
(B)-05
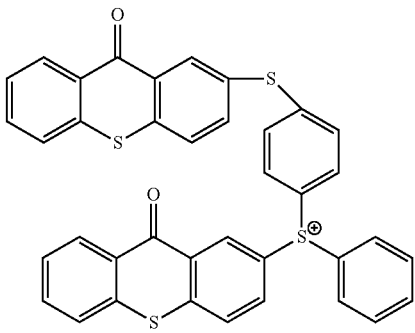
(B)-07
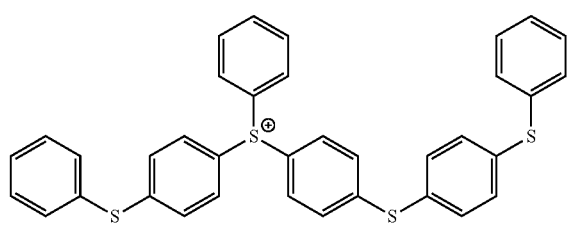
[Chemical formula 30]
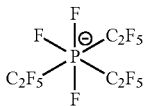
[Chemical formula 31]
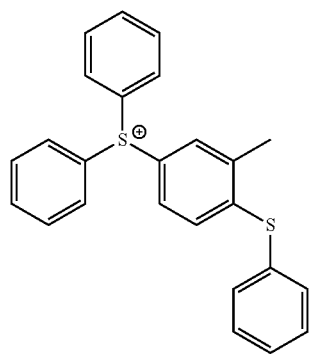
(B)-06
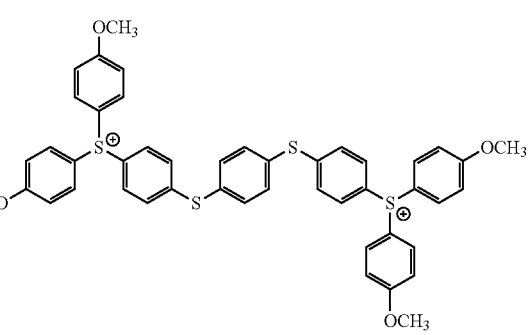
(B)-08
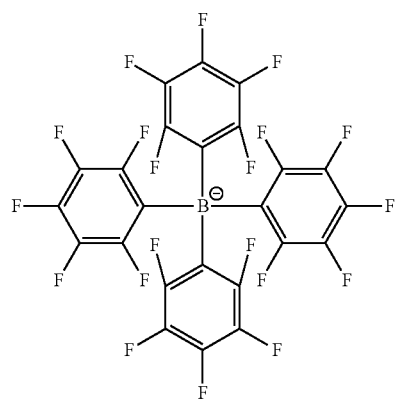
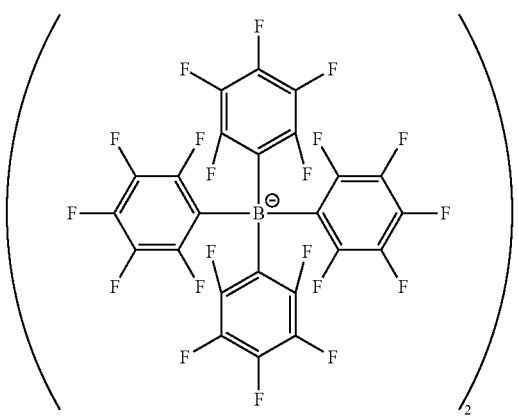

(B)-09
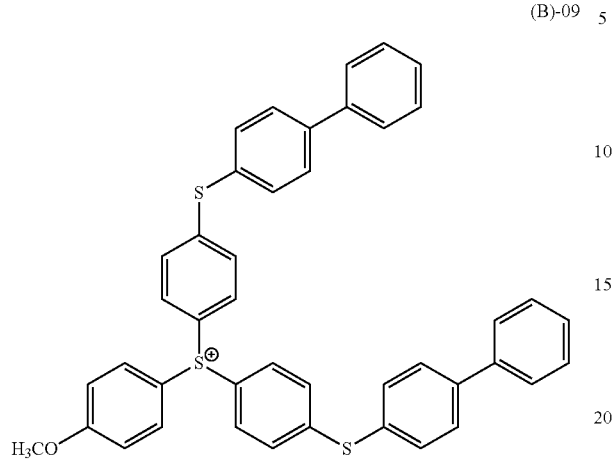
[Chemical formula 32]
(B)-010
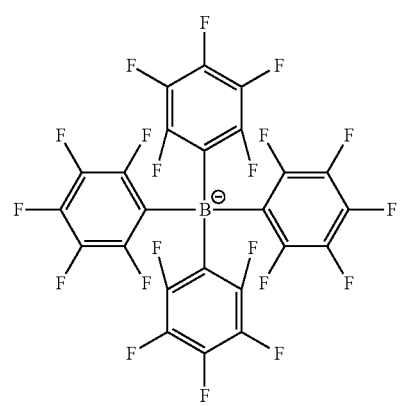
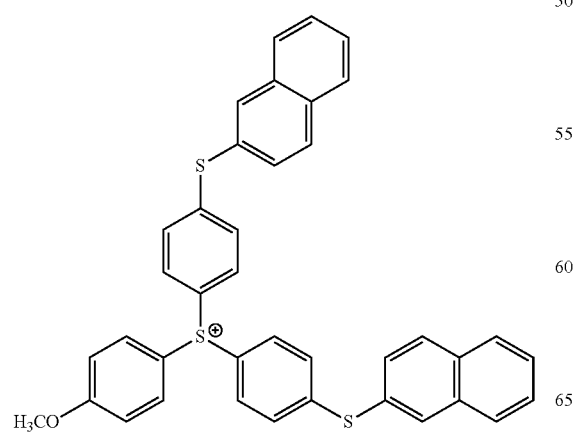
(B)-011
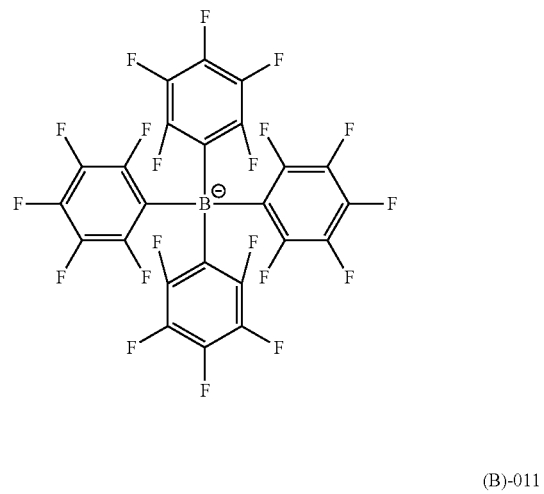
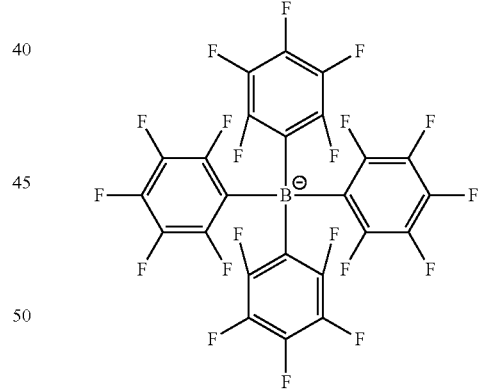
(B)-012
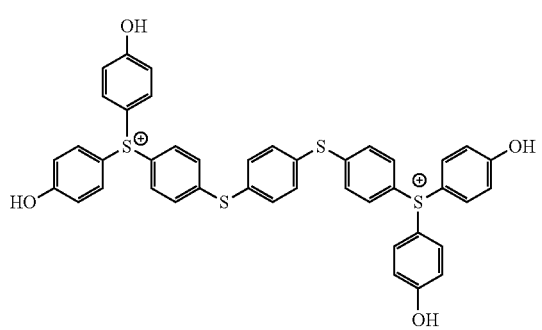

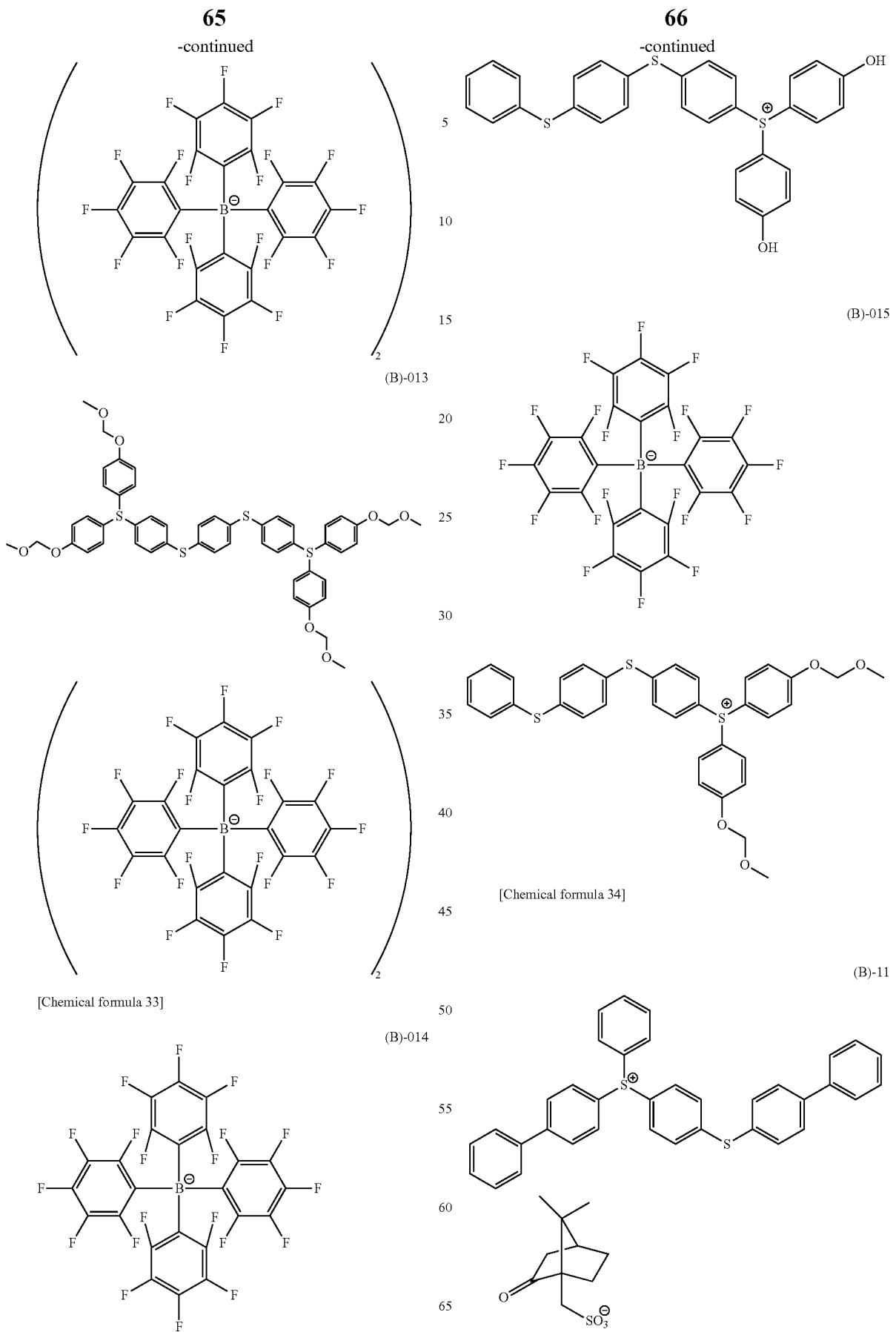

-continued

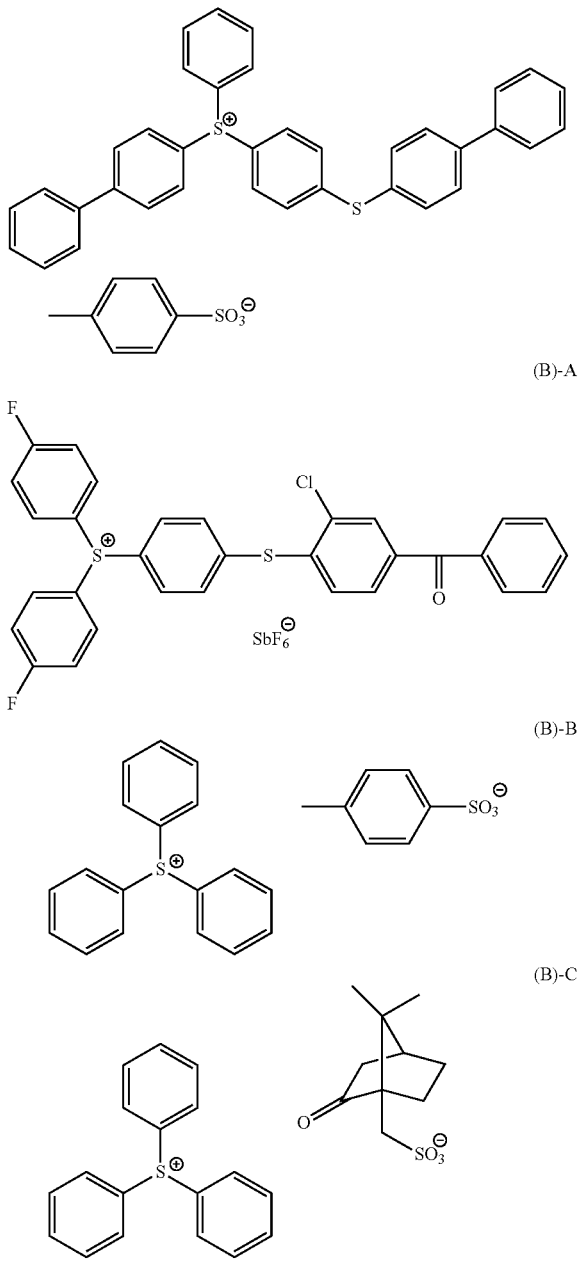

Formation of Pattern 1: Examples 1 to 8, Examples 11 to 36, Comparative Examples 1 to 3, and Reference Examples 1 and 2

The negative photosensitive compositions obtained in Examples 1 to 8, Examples 11 to 36, Comparative Examples 1 to 3, and Reference Examples 1 and 2 each were coated on a base material film (trade name: Purex (registered trademark) film A53, film thickness: 50 μm, manufactured by Teijin DuPont Films Japan Ltd.) using a film coater (applicator), heated at a temperature of 60° C. for 5 minutes, and then a baking process (PAB) was performed at 70° C. for 10 minutes to form a photosensitive film having a film thickness of 50 μm. By laminating a cover film (trade name: Purex (registered trademark) film A31, film thickness: 25 μm, manufactured by Teijin DuPont Films Japan Ltd.) from above onto the photosensitive film, a photosensitive dry film was obtained.

The obtained photosensitive dry film was laminated on an 8-inch Si wafer (80° C., 0.3 MPa, 0.5 m/min). Thereafter, the base material film was peeled off and selective irradiation with ghi lines was performed at a radiation dose of 300 mJ/cm².

Thereafter, heating was performed on a hot plate at 90° C. for 5 minutes after exposure.

Next, immersion development was carried out with PGMEA for 10 minutes at 23° C., and the film was thoroughly drained and dried to obtain a line and space pattern (may be simply referred to below as "LS pattern"). For adhesiveness evaluation, 1:3 LS patterns having a line width of 6 μm/space width of 18 μm, a line width of 8 μm/space width of 24 μm, and a line width of 10 μm/space width of 30 μm were obtained. For resolution evaluation, 1:1 LS patterns having a line width of 8 μm/space width of 8 μm, a line width of 10 μm/space width of 10 μm, and a line width of 20 μm/space width of 20 μm were obtained.

Formation of Pattern 2: Examples 9 to 10

The negative photosensitive compositions obtained in Examples 9 to 10 were each uniformly coated on 8-inch Si wafers by with a spinner, heated at a temperature of 60° C. for 5 minutes, and then a baking treatment (PAB) was performed at 70° C. for 10 minutes to form a photosensitive film (film thickness: 50 μm).

Thereafter, the photosensitive film was selectively irradiated with ghi lines at a radiation dose of 300 mJ/cm² and heating was carried out after exposure for 5 minutes on a hot plate at 90° C.

Next, immersion development was carried out with PGMEA for 10 minutes at 23° C., and the film was thoroughly drained and dried to obtain a line and space pattern (may be simply referred to below as "LS pattern"). For adhesiveness evaluation, 1:3 LS patterns having a line width of 6 μm/space width of 18 μm, a line width of 8 μm/space width of 24 μm, and a line width of 10 μm/space width of 30 μm were obtained. For resolution evaluation, 1:1 LS patterns having a line width of 8 μm/space width of 8 μm, a line width of 10 μm/space width of 10 μm, and a line width of 20 μm/space width of 20 μm were obtained.

<Evaluation of Optimum Exposure Amount (Eop)>

An optimum exposure amount Eop (mJ/cm²) at which a target LS pattern is formed in the formation of the pattern was determined. The results are shown as "Eop (mJ/cm²)" in Tables 4 to 5.

<Evaluation of Pattern Collapse>

In the formation of the pattern, the LS pattern was formed by suitably changing the exposure amount (mJ/cm²) and the focal point. At this time, the maximum dimension of the line portion in the pattern resolved without causing pattern collapse was measured using a critical dimension SEM (acceleration voltage 300 V). A scanning electron microscope (trade name: S-9380) manufactured by Hitachi High-Technologies Corporation was used as the length measuring SEM. The smaller the dimensions are, the better the adhesiveness is.

Tables 4 to 5 show the maximum dimensions of the line portion in the resolved LS pattern as "adhesiveness (μm)".

<Evaluation of Resolution>

The limit resolution (μm) of the line at the optimum exposure amount Eop at which the pattern was formed was evaluated using an optical microscope. The results are shown as "resolution (μm)" in Tables 4 to 5.

<Evaluation of Roughness>

The side wall of the LS pattern obtained above was observed with a scanning electron microscope S-9220 (manufactured by Hitachi, Ltd.). The results of evaluations performed based on the following criteria are shown in Tables 4 to 5 as "roughness".

A: Pattern side wall has extremely good surface characteristics.
B: Pattern side wall has good surface characteristics.
C: Slight vertical streaks are recognized on the side wall of the pattern.
D: Vertical streaks are recognized on the side wall of the pattern.

TABLE 4

|  | Eop (mJ/cm$^2$) | Adhesiveness (μm) | Resolution (μm) | Roughness |
|---|---|---|---|---|
| Example 1 | 300 | 6 | 10 | B |
| Example 2 | 300 | 6 | 10 | B |
| Example 3 | 300 | 6 | 10 | B |
| Example 4 | 300 | 8 | 10 | B |
| Example 5 | 300 | 8 | 10 | B |
| Example 6 | 300 | 8 | 10 | B |
| Example 7 | 300 | 10 | 10 | B |
| Example 8 | 400 | 10 | 10 | B |
| Example 9 | 300 | 6 | 8 | A |
| Example 10 | 300 | 6 | 10 | A |
| Example 11 | 300 | 10 | 10 | B |
| Example 12 | 300 | 10 | 10 | B |
| Comparative Example 1 | 300 | 10 | 20 | C |
| Comparative Example 2 | 300 | 10 | 10 | D |
| Comparative Example 3 | 500 | 10 | 10 | D |

TABLE 5

|  | Eop (mJ/cm$^2$) | Adhesiveness (μm) | Resolution (μm) | Roughness |
|---|---|---|---|---|
| Example 13 | 300 | 10 | 10 | B |
| Example 14 | 300 | 10 | 10 | B |
| Example 15 | 300 | 10 | 10 | B |
| Example 16 | 300 | 10 | 10 | B |
| Example 17 | 300 | 10 | 10 | B |
| Example 18 | 300 | 10 | 10 | B |
| Example 19 | 300 | 10 | 10 | B |
| Example 20 | 300 | 10 | 10 | B |
| Example 21 | 300 | 8 | 10 | B |
| Example 22 | 300 | 10 | 10 | B |
| Example 23 | 300 | 10 | 10 | B |
| Example 24 | 300 | 10 | 10 | B |
| Example 25 | 300 | 8 | 10 | B |
| Example 26 | 300 | 10 | 10 | B |
| Example 27 | 300 | 10 | 10 | B |
| Example 28 | 300 | 10 | 10 | B |
| Example 29 | 300 | 10 | 10 | B |
| Example 30 | 300 | 10 | 10 | B |
| Example 31 | 300 | 10 | 10 | B |
| Example 32 | 300 | 10 | 10 | B |
| Example 33 | 300 | 8 | 10 | B |
| Example 34 | 300 | 10 | 10 | B |
| Example 35 | 300 | 8 | 10 | B |
| Example 36 | 300 | 10 | 10 | B |
| Reference Example 1 | 300 | 10 | 20 | C |
| Reference Example 2 | 500 | 10 | 20 | C |

With respect to a comparison of Examples 1 to 7 and Examples 11 to 12 with Comparative Examples 1 to 2 and Reference Examples 1 and 2, and a comparison of Example 8 with Comparative Example 3, since Examples 1 to 8 and Examples 11 to 12 had comparable or better values with respect to adhesiveness as compared with Comparative Examples 1 to 3 and Reference Examples 1 and 2, pattern collapse did not occur even when the line portion was small and the space portion was large, and it was confirmed that the pattern adhered well to the support.

Furthermore, it was confirmed that Examples 1 to 8 and Examples 11 to 36 had resolution equal to or better than Comparative Examples 1 to 3 and Reference Examples 1 and 2.

Furthermore, it was also confirmed that Examples 1 to 8 and Examples 11 to 36 had roughness characteristics superior to those of Comparative Examples 1 to 3 and Reference Examples 1 and 2.

Here, evaluation was carried out in the same manner as in Examples 1 to 36 except that the component (B0) was not added, and resolution was not obtained due to insufficient sensitivity, and it was not possible to obtain a pattern (result omitted).

In addition, the compositions of Examples 9 and 10 in which a pattern was formed by directly coating a liquid negative photosensitive composition onto a support without forming a film were also confirmed to have good sensitivity, adhesiveness, resolution, and roughness characteristics.

The invention claimed is:

1. A negative photosensitive composition comprising:

an epoxy group-containing resin (A); and a cationic polymerization initiator (B) which comprises at least one cationic polymerization initiator (B0) selected from the group consisting of compounds represented by general formula (b0-1) and compounds represented by general formula (b0-2), and a cationic polymerization initiator (B1) which generates an acid having a pKa of −3 or more, wherein a ratio between the cationic polymerization initiator (B0) and the cationic polymerization initiator (B1) is 5 to 200 as a mass ratio represented by component (B0)/component (B1), and the cationic polymerization initiator (B1) comprises at least one compound selected from the group consisting of compounds represented by general formula (b1-1') and compounds represented by general formula (b1-2'):

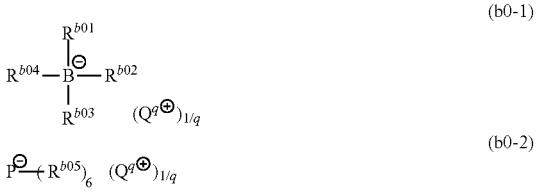

wherein $R^{b01}$ to $R^{b04}$ are each independently a fluorine atom or an aryl group which may have a substituent, $R^{b05}$ is a fluorine atom or a fluorinated alkyl group which may have a substituent, plural $R^{b05}$'s may be the same as or different from each other, q is an integer of 1 or more, and $Q^{q+}$'s are each independently a q-valent organic cation; and

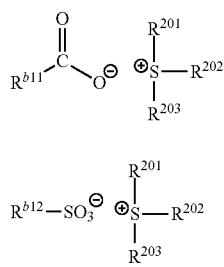
(b1-1′)

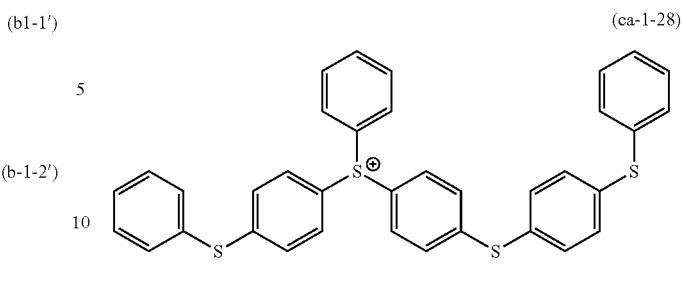
(ca-1-28)

(b-1-2′)

wherein $R^{b11}$ and $R^{b12}$ each are a cyclic group which may have a substituent other than a halogen atom, a chain alkyl group which may have a substituent other than a halogen atom, or a chain alkenyl group which may have a substituent other than a halogen atom, $R^{201}$ to $R^{203}$ each independently represent an aryl group which may have a substituent, a heteroaryl group, an alkyl group, or an alkenyl group, and $R^{201}$ to $R^{203}$, may be bonded to each other to form a ring with the sulfur atom in the formula, provided that at least one of $R^{201}$, $R^{202}$, and $R^{203}$ is an organic group having 16 or more carbon atoms.

2. The negative photosensitive composition according to claim 1, wherein the cation moiety of the cationic polymerization initiator (B1) is a cation represented by formula (ca-1-25), (ca-1-26), (ca-1-28), (ca-1-29), (ca-1-30), (ca-1-31), (ca-1-32), (ca-1-33), (ca-1-34), (ca-1-35), (ca-1-38), or (ca-1-46):

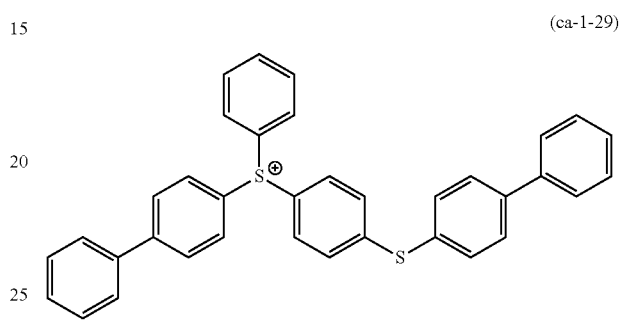
(ca-1-29)

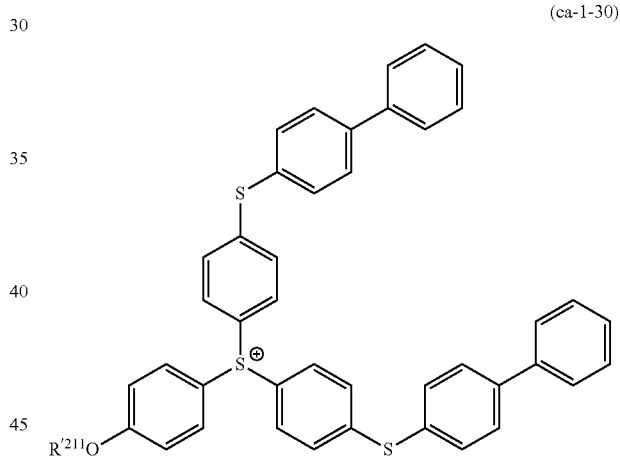
(ca-1-30)

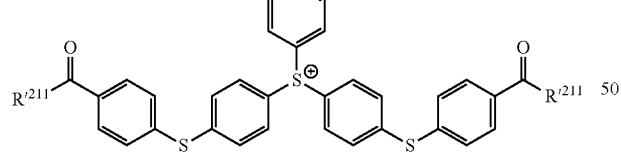
(ca-1-25)

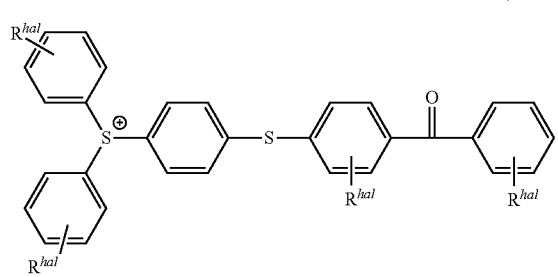
(ca-1-26)

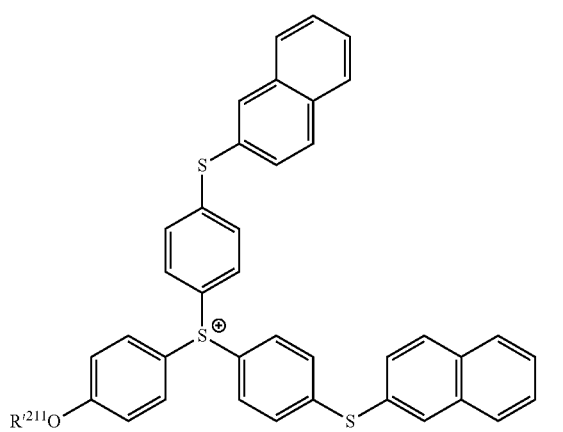
(ca-1-31)

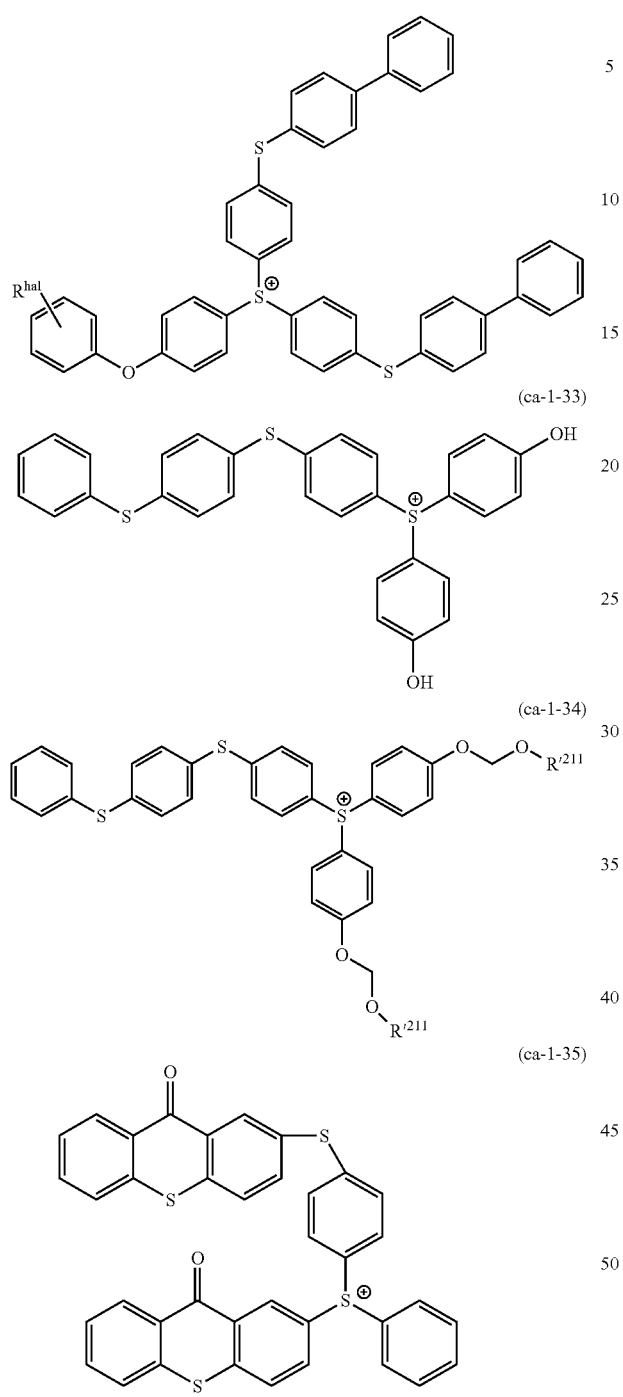

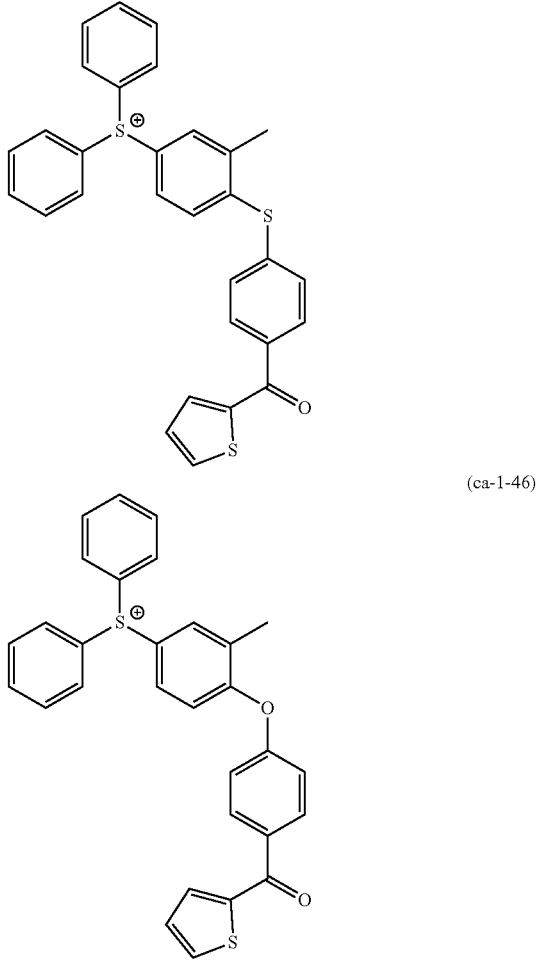

wherein R'²¹¹ is an alkyl group and R^hal is a hydrogen atom or a halogen atom.

3. The negative photosensitive composition according to claim 1,
   wherein the epoxy group-containing resin (A) comprises at least one resin selected from the group consisting of a novolac epoxy resin, a bisphenol A epoxy resin, and a bisphenol F epoxy resin.

4. A pattern formation method comprising:
   forming a film on a support using the negative photosensitive composition according to claim 1;
   selectively exposing the film; and
   developing the exposed film to form a negative pattern.

* * * * *